US012619151B2

(12) United States Patent
Liu et al.

(10) Patent No.: US 12,619,151 B2
(45) Date of Patent: May 5, 2026

(54) MONITOR STRUCTURE FOR PHOTORESIST THICKNESS IN TRENCH

(71) Applicant: Texas Instruments Incorporated, Dallas, TX (US)

(72) Inventors: Yunlong Liu, Beijing (CN); Hong Yang, Wylie, TX (US); Peng Li, Chongqing (CN); Yung Shan Chang, Plano, TX (US); Sheng Pin Yang, Chengdu (CN); Ya Ping Chen, Chengdu (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 572 days.

(21) Appl. No.: 18/308,901

(22) Filed: Apr. 28, 2023

(65) Prior Publication Data

US 2024/0361699 A1     Oct. 31, 2024

(51) Int. Cl.
G03F 7/22 (2006.01)
G01B 5/06 (2006.01)
G01B 11/06 (2006.01)
G03F 7/039 (2006.01)

(52) U.S. Cl.
CPC ................. G03F 7/22 (2013.01); G01B 5/06 (2013.01); G01B 11/06 (2013.01); G03F 7/039 (2013.01)

(58) Field of Classification Search
CPC .. G03F 7/22; G03F 7/039; G01B 5/06; G01B 11/06

USPC ..................................................... 430/30, 311
See application file for complete search history.

(56) References Cited

U.S. PATENT DOCUMENTS

| | | | |
|---|---|---|---|
| 10,466,597 B2 | 11/2019 | Sherwin | |
| 2002/0009675 A1* | 1/2002 | Jeng ................... | H01L 21/0274 |
| | | | 430/312 |
| 2019/0296115 A1* | 9/2019 | Chen .................... | H10D 30/668 |
| 2019/0363059 A1* | 11/2019 | Tanaka ................... | H01L 24/02 |

* cited by examiner

*Primary Examiner* — Caleen O Sullivan
(74) *Attorney, Agent, or Firm* — Ronald O. Neerings; Frank D. Cimino

(57) ABSTRACT

A method of forming a microelectronic device includes forming positive tone photoresist on the microelectronic device, filling a trench, extending over a top surface adjacent to the trench, and covering a thickness monitor on a substrate containing the microelectronic device. The photoresist in and over the trench is exposed at a trench energy dose, and the photoresist in the monitor area is exposed at a monitor energy dose that is less than the trench energy dose. The photoresist is developed, leaving photoresist in the trench having an in-trench thickness less than the depth of the trench and leaving an in-monitor thickness of the photoresist on the monitor area less than an unexposed thickness. The in-monitor thickness of the photoresist on the monitor area may be measured and the measured thickness value may be used with a calibration chart to estimate the in-trench thickness of the photoresist.

23 Claims, 37 Drawing Sheets

MONITOR STRUCTURE FOR PHOTORESIST THICKNESS IN TRENCH

TECHNICAL FIELD

This disclosure relates to the field of microelectronic devices. More particularly, but not exclusively, this disclosure relates to trenches in microelectronic devices.

BACKGROUND

Many microelectronic devices include trenches, for example, isolation trenches, gate trenches, or field plate trenches. During fabrication of some of these devices, photoresist is formed in the trenches, partially filling the trenches to a desired thickness. Attaining the desired thickness of the photoresist in the trenches is frequently challenging.

SUMMARY

A method of forming a microelectronic device includes forming photoresist on the microelectronic device, filling a trench of the microelectronic device and extending over a top surface of the microelectronic device adjacent to the trench. The photoresist also covers a thickness monitor on a substrate containing the microelectronic device. The photoresist is a positive tone photoresist. The photoresist in and over the trench is exposed at a trench energy dose, and the photoresist in the monitor area is exposed at a monitor energy dose that is less than the trench energy dose. The photoresist is developed, leaving an in-trench thickness of the photoresist in the trench and leaving an in-monitor thickness of the photoresist on the monitor area. The in-monitor thickness of the photoresist on the monitor area may be measured and the measured thickness value may be used to estimate the in-trench thickness of the photoresist in the trench.

DETAILED DESCRIPTION

Figure 1A:
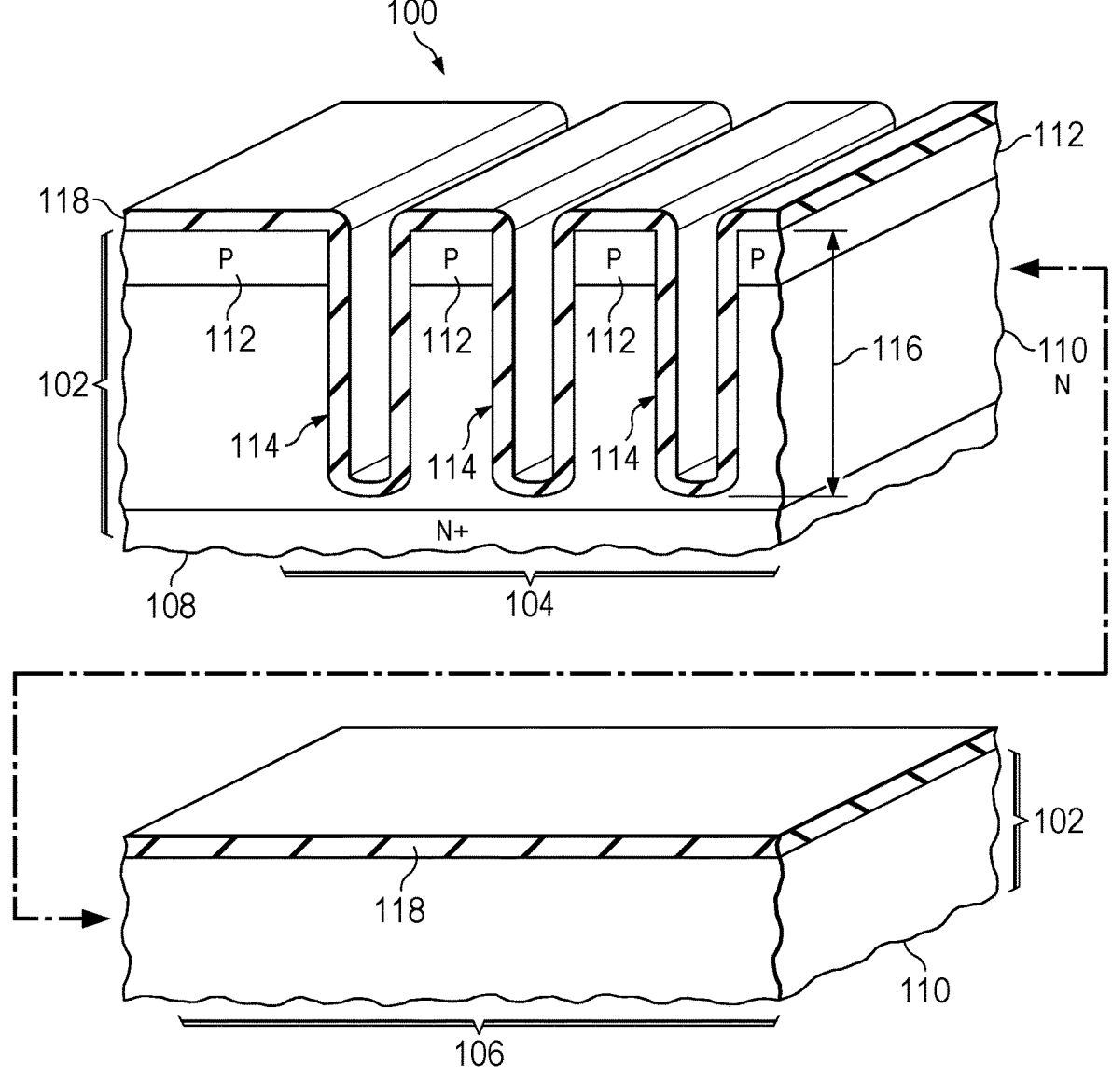
FIG. 1A through FIG. 1O are cross sections of an example method of forming a microelectronic device.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A microelectronic device includes a trench in a substrate. A method of forming the microelectronic device includes forming photoresist on the microelectronic device, filling the trench, and extending over a top surface of the microelectronic device adjacent to the trench. The photoresist also covers a thickness monitor, which is planar, on the substrate. The monitor area may be located within the microelectronic device, or may be located outside the microelectronic device.

The photoresist is subsequently heated in a pre-bake operation to remove at least a portion of solvents from the photoresist. After the pre-bake operation, the photoresist may be rehydrated to attain a desired water content. After the photoresist has been rehydrated, the photoresist on the thickness monitor has a pre-exposure thickness, which may be 1 micron to 3 microns, by way of example.

The photoresist is a positive tone photoresist, that is, exposing the photoresist to ultraviolet (UV) light in a specific wavelength band will increase solubility of the photoresist in a developer solution. Unexposed photoresist absorbs the UV light with an absorption length of 0.5 microns to 2 microns. Photoresist at an upper surface of the photoresist is exposed before underlying portions of the photoresist. As the photoresist at the upper surface is exposed, its absorption coefficient decreases, so that the underlying unexposed photoresist is subsequently exposed. Exposure by the UV light is commonly expressed as a dose, measured in units of energy per unit area, such as millijoules per square centimeter ($mJ/cm^2$). The exposure dose is absorbed by the photoresist through the volume of the photoresist, at an energy density, expressed in units of energy per unit volume, such as joules per cubic centimeter ($J/cm^3$). The photoresist absorbs the UV light at top levels of the photoresist downward. As more UV light is absorbed, the exposed photoresist becomes more transparent to the UV light, and thus the photoresist at deeper levels is subsequently exposed more completely. At least a top portion, or all, of the photoresist absorbs a full exposure energy density that is sufficient to convert the photoresist to a chemical form that is soluble in the developer solution. The full exposure energy density varies according to formulation of the photoresist. The exposure dose to expose a given thickness of photoresist at or above the full exposure energy density increases and the thickness increases.

The photoresist in and over the trench is exposed at a first trench energy dose, which does not expose all the photoresist in the trench, leaving a trench portion of the photoresist, in a bottom portion of the trench, underexposed, that is, insoluble in the developer solution. The photoresist on the thickness monitor is exposed at a first monitor energy dose that is less than the first trench energy dose. The first trench energy dose does not expose all the photoresist on the thickness monitor, leaving a monitor portion of the photoresist underexposed.

After the photoresist is exposed, the photoresist is developed by dissolving exposed portions of the photoresist in a developer solution. An unexposed portion of the photoresist remains in the trench, with an in-trench thickness that is less than a depth of the trench. Another unexposed portion of the photoresist remains on the thickness monitor with an in-monitor thickness that is less than the pre-exposure thickness. For example, the in-monitor thickness may be 30 percent to 70 percent of the pre-exposure thickness.

The in-monitor thickness of the photoresist on the monitor area is subsequently measured, and the measured thickness value may be used to estimate the in-trench thickness of the photoresist in the trench. The in-monitor thickness of the photoresist may be measured by any of several commonly used metrology processes, such as stylus profilometry, atomic force microscopy (AFM) profilometry, ellipsometry, optical reflection spectroscopy, or optical profilometry, which may be performed during the fabrication process without degrading or damaging the microelectronic device. The in-trench thickness may be estimated from the measured thickness value of the in-monitor thickness using an empirical calibration chart, a process model of the photolithographic operation, or a combination thereof. Other methods of acquiring the in-trench thickness of the photoresist in the trench, such as cross sectioning the substrate, are disadvantageously more expensive and time consuming, and may damage the measurement site. If the in-trench thickness of the photoresist in the trench is out of a desired range, the microelectronic device may be reworked, saving an expense associated with completing fabrication and subsequent yield loss.

In one aspect, the photoresist in the trench may be used as an etch mask in forming a stepped dielectric liner in the trench. In another aspect, the photoresist in the trench may be used as an implant mask for dopants implanted into the substrate along sidewalls of the trench above the photoresist. Other fabrication sequences using the photoresist in the trench are within the scope of this disclosure.

Figure 1B:
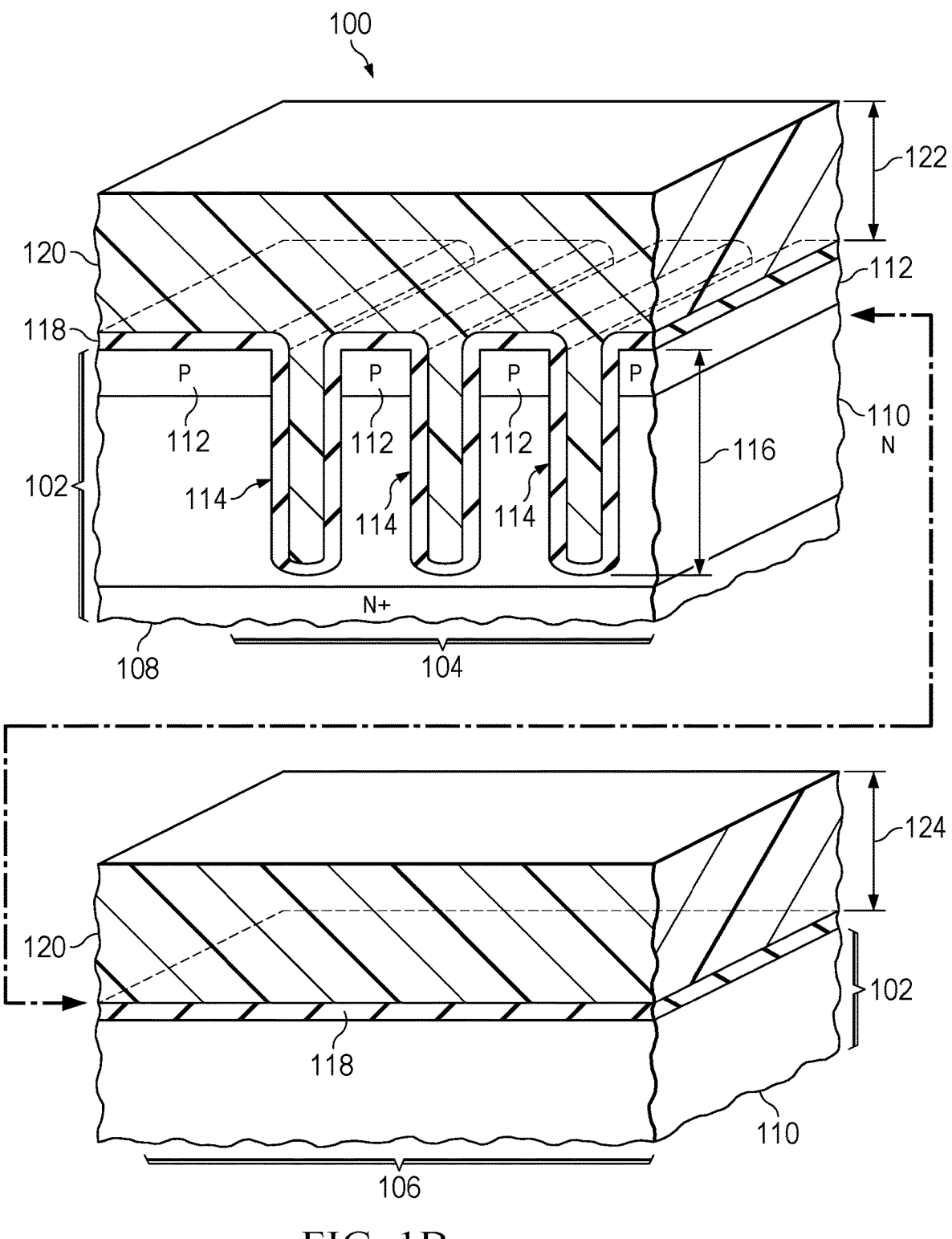
Figure 1C:
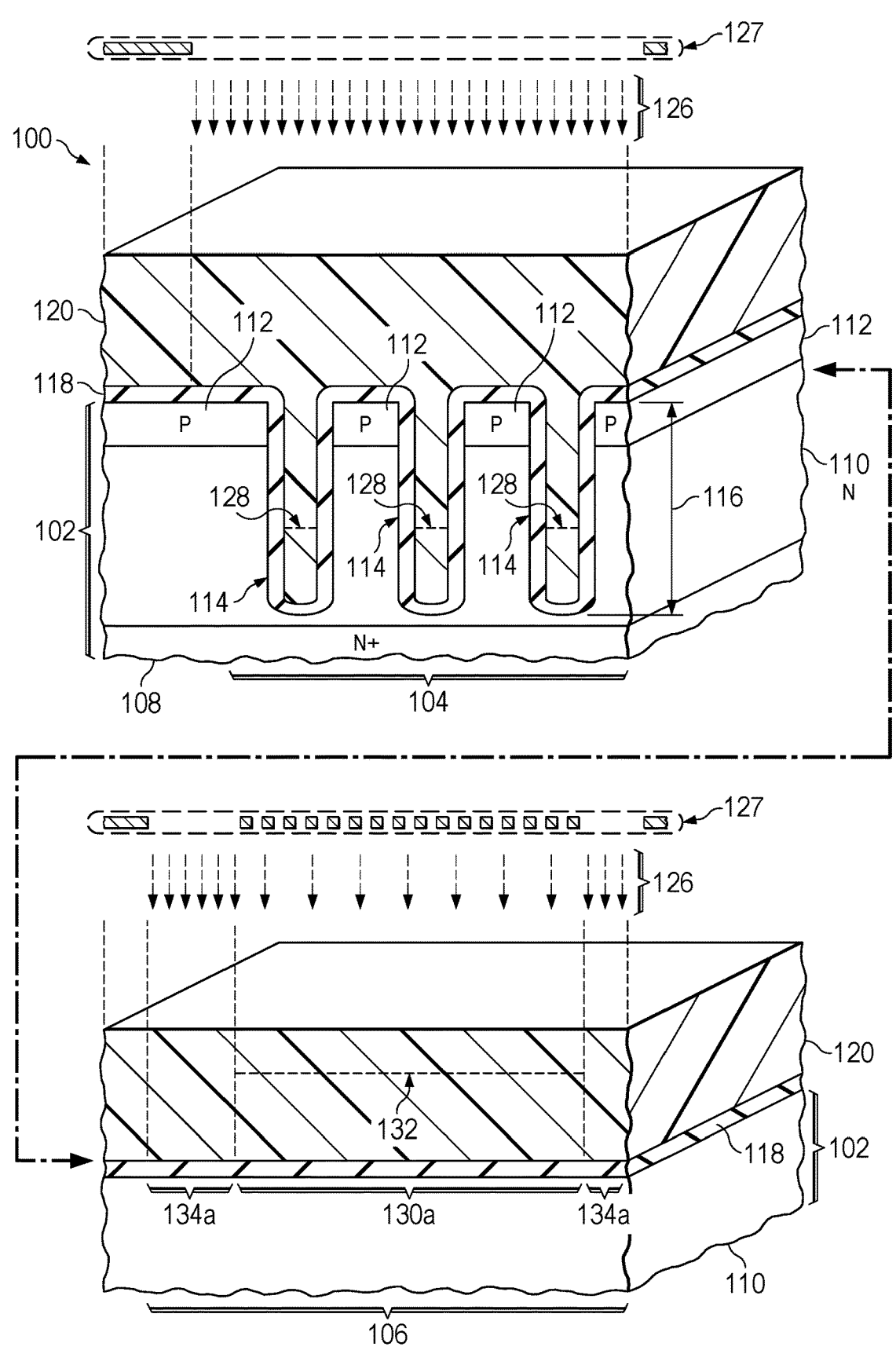
Figure 1D:
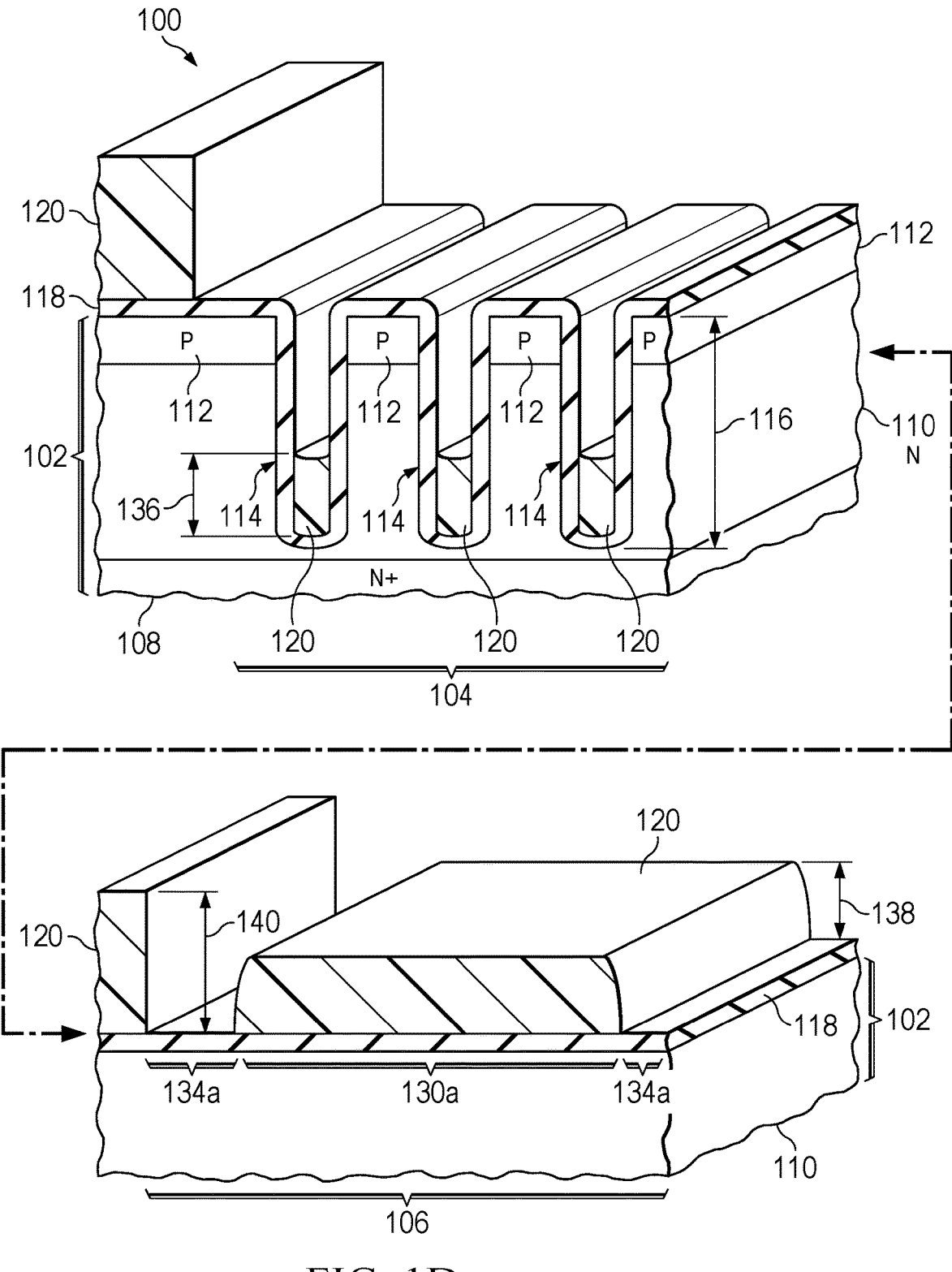
Figure 1E:
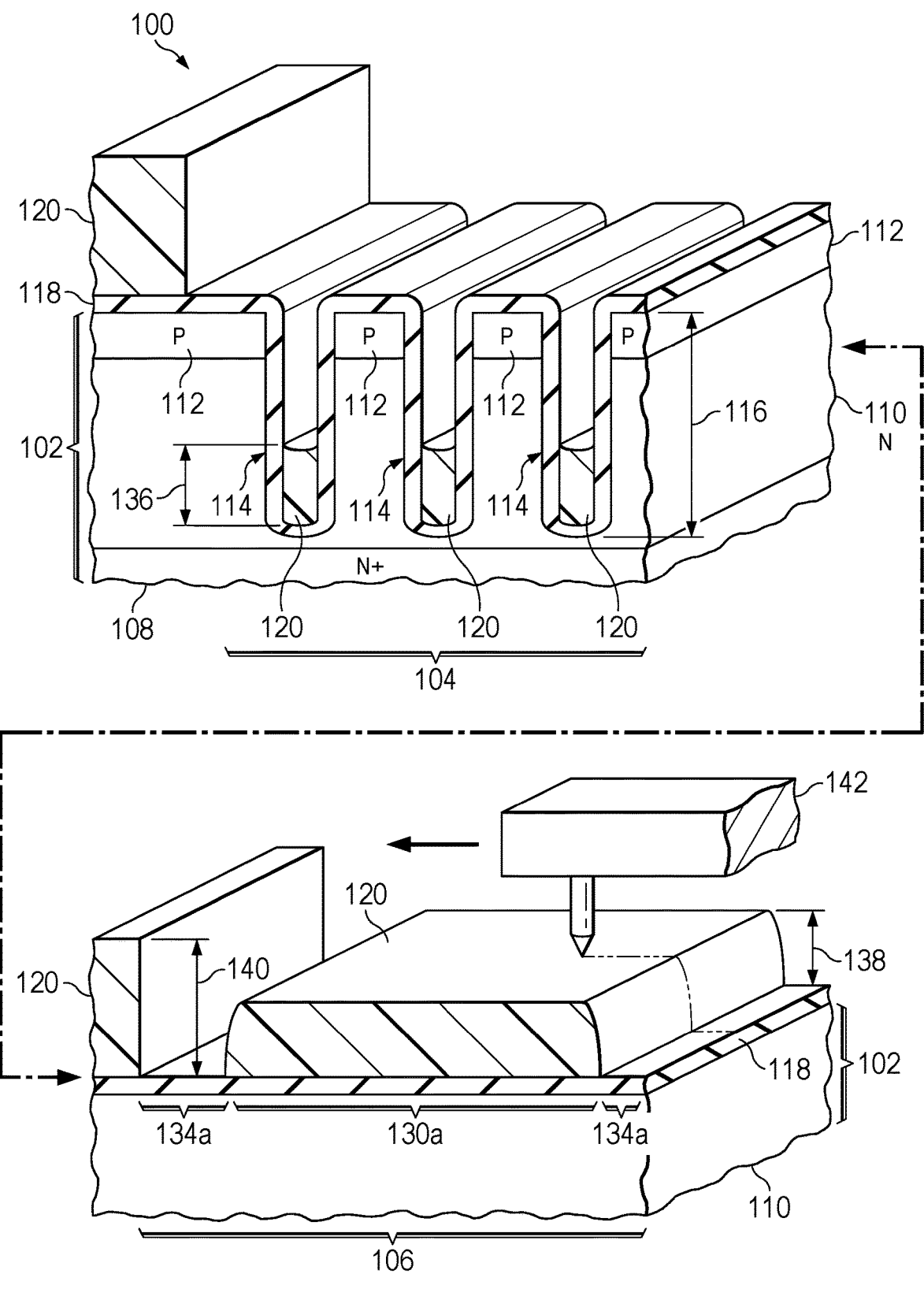
Figure 1F:
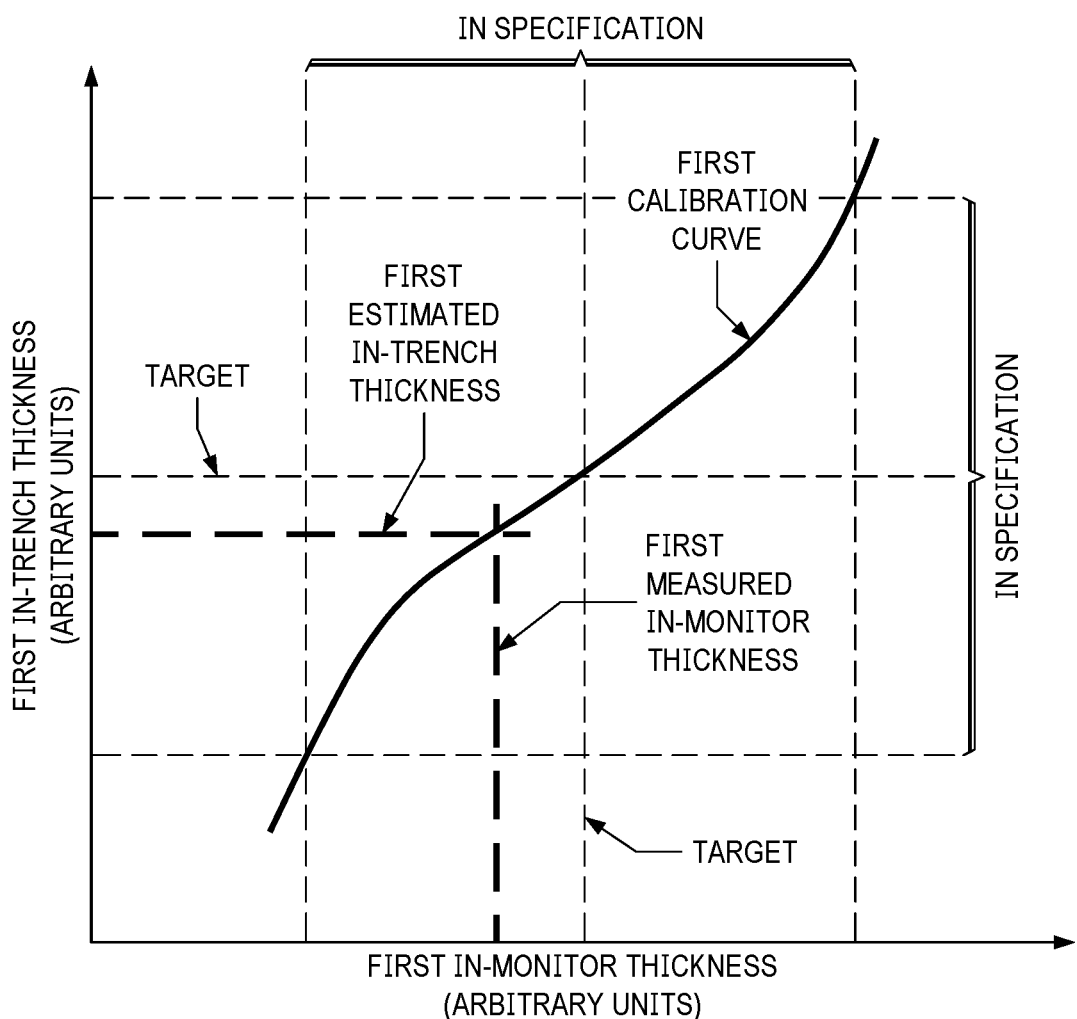
Figure 1G:
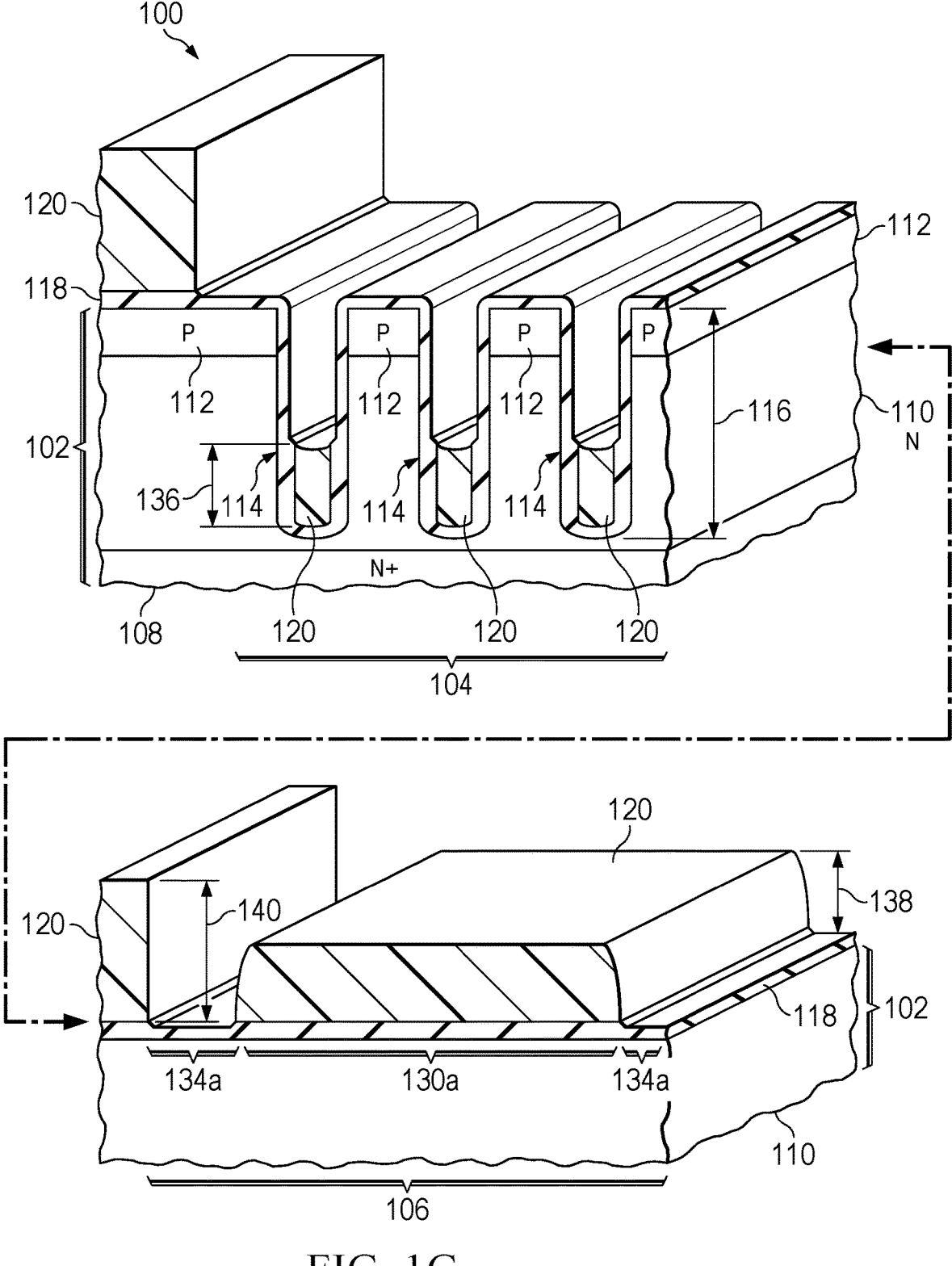
Figure 1H:
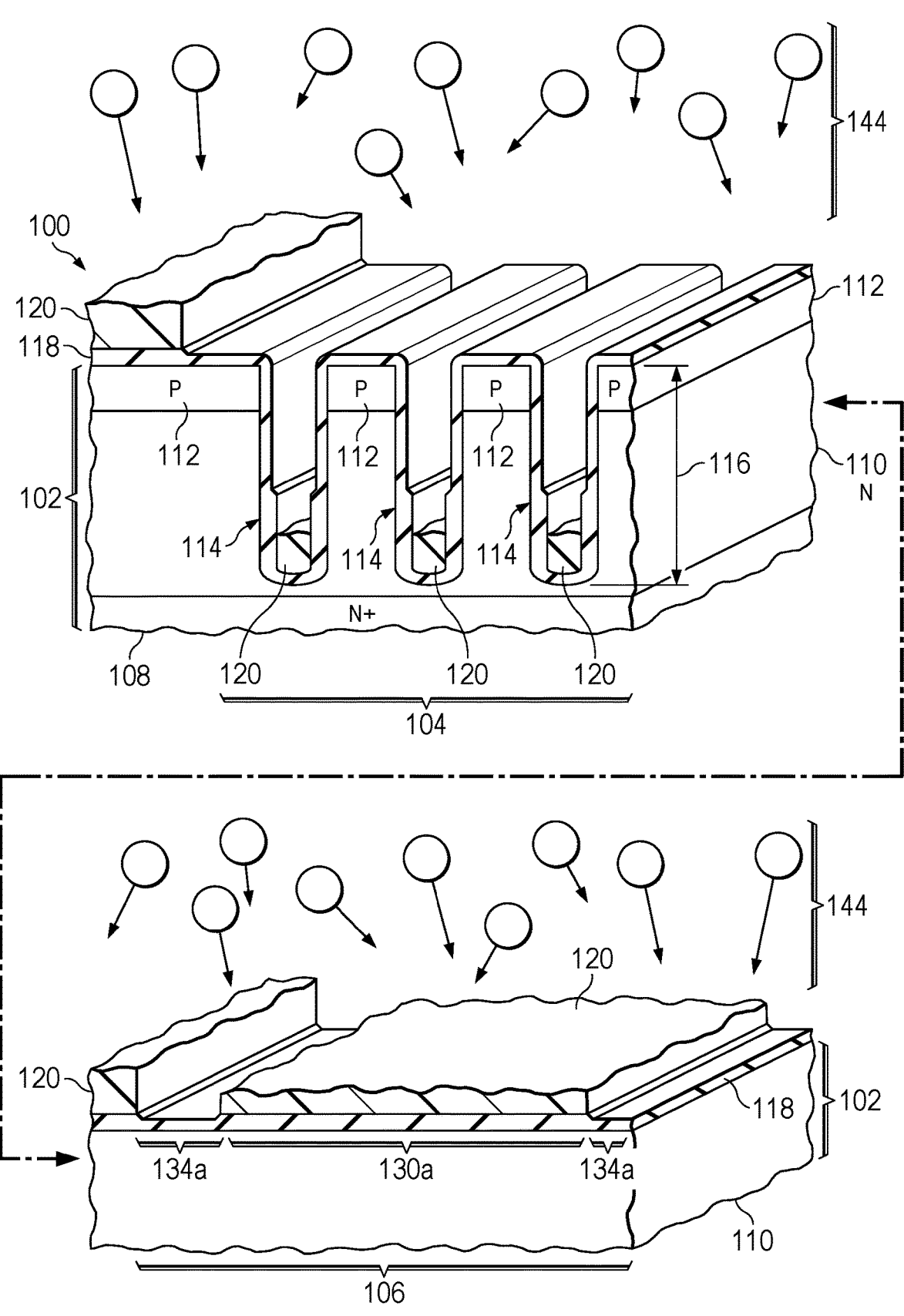
Figure 1I:
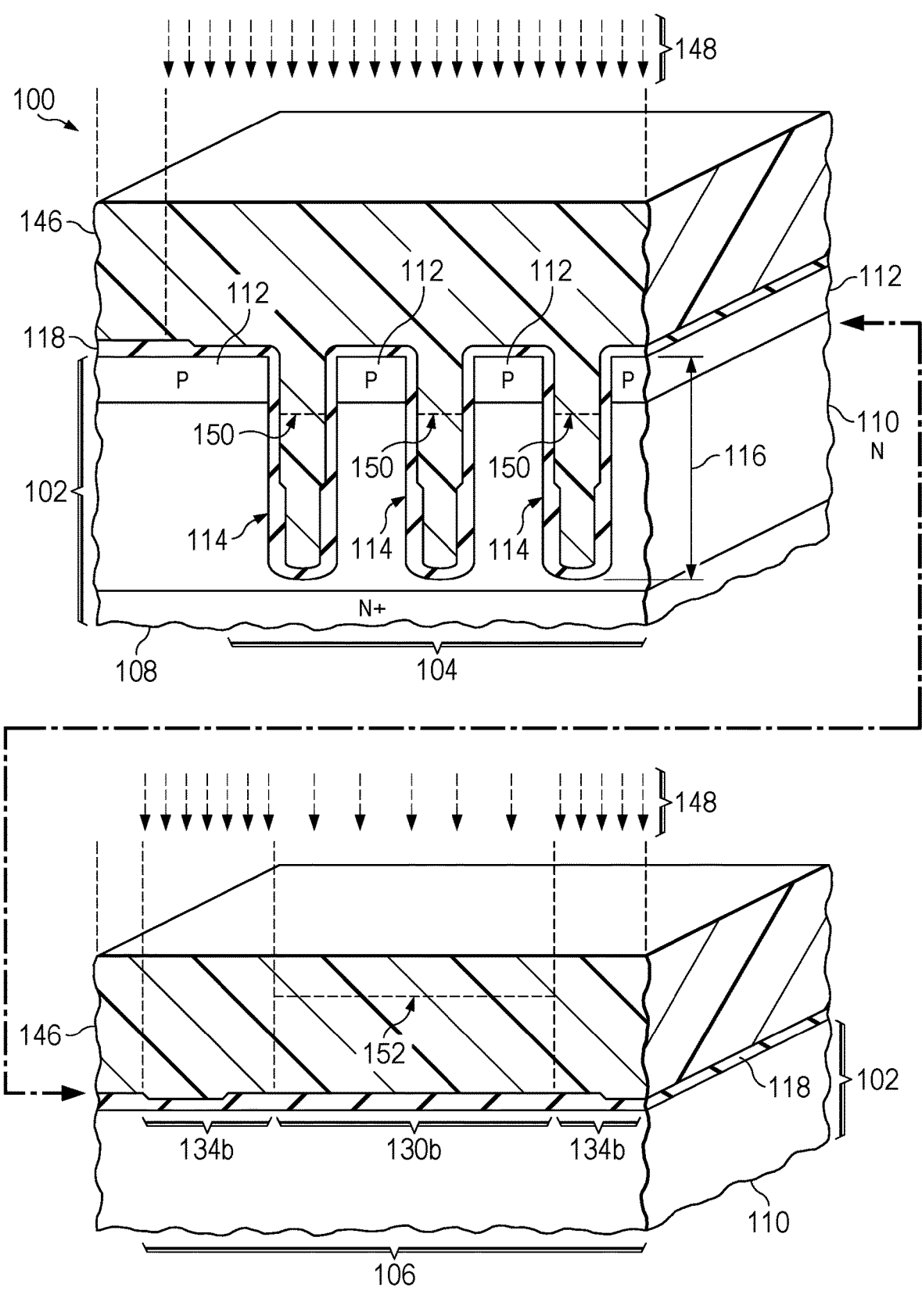
Figure 1J:
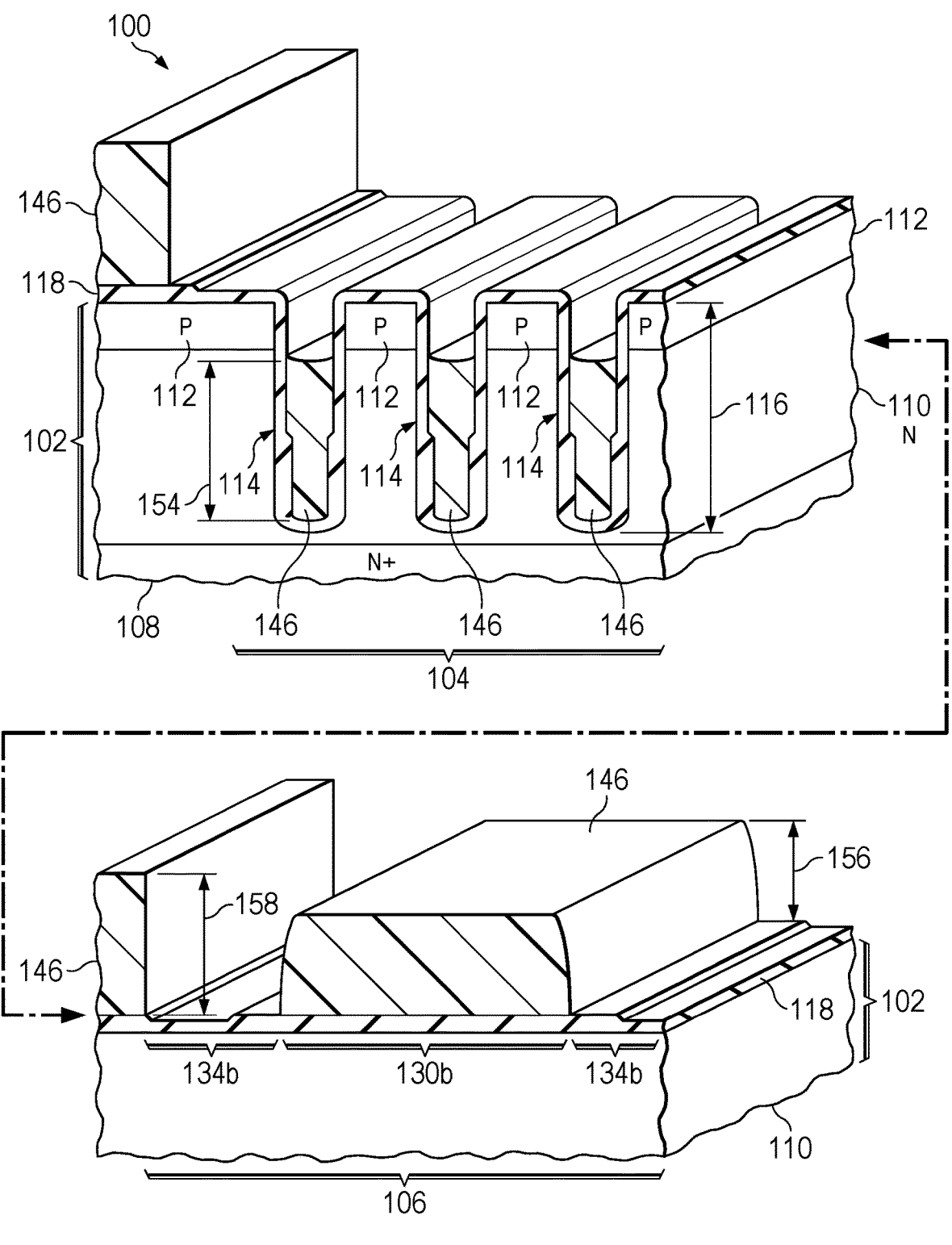
Figure 1K:
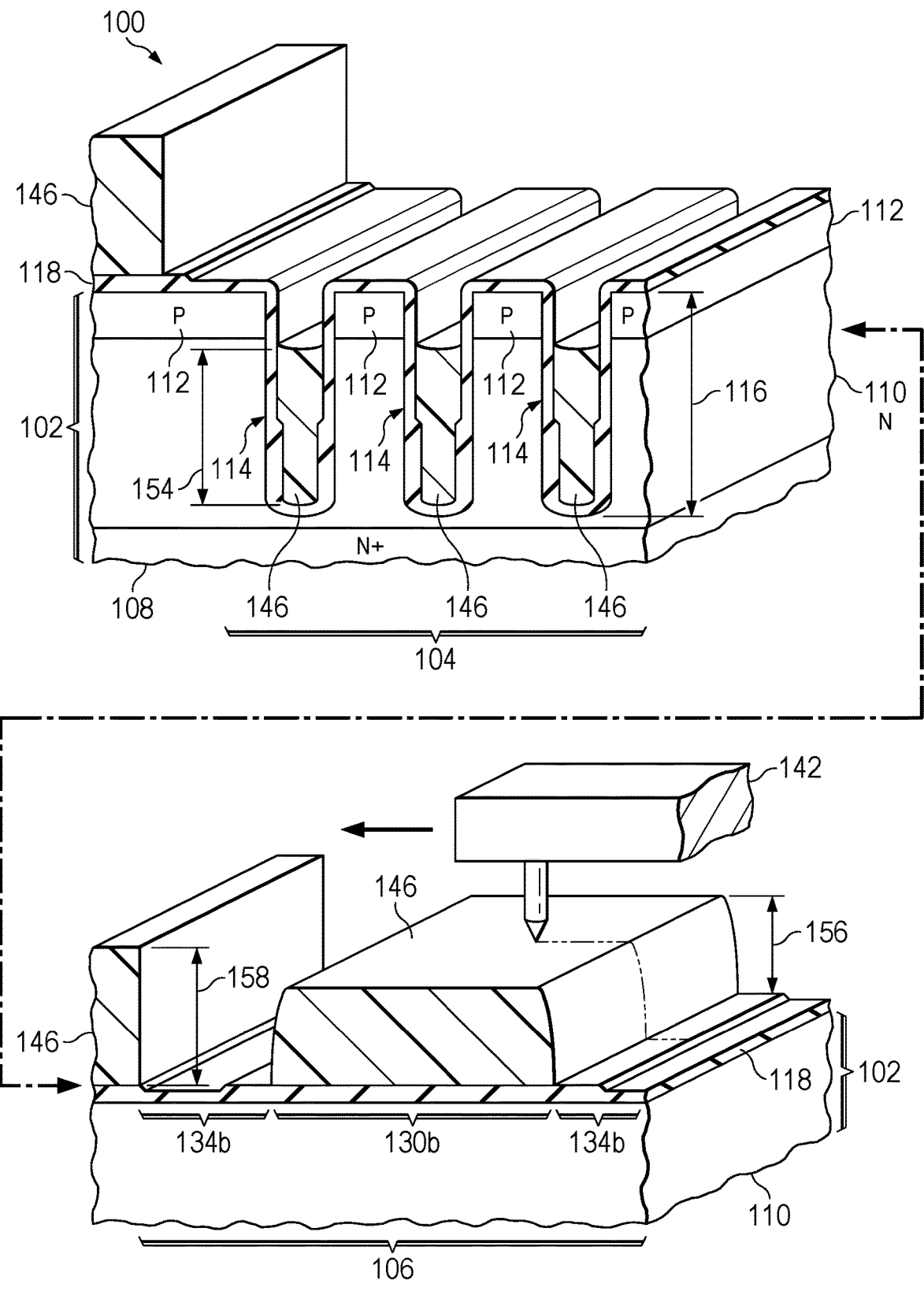
Figure 1L:
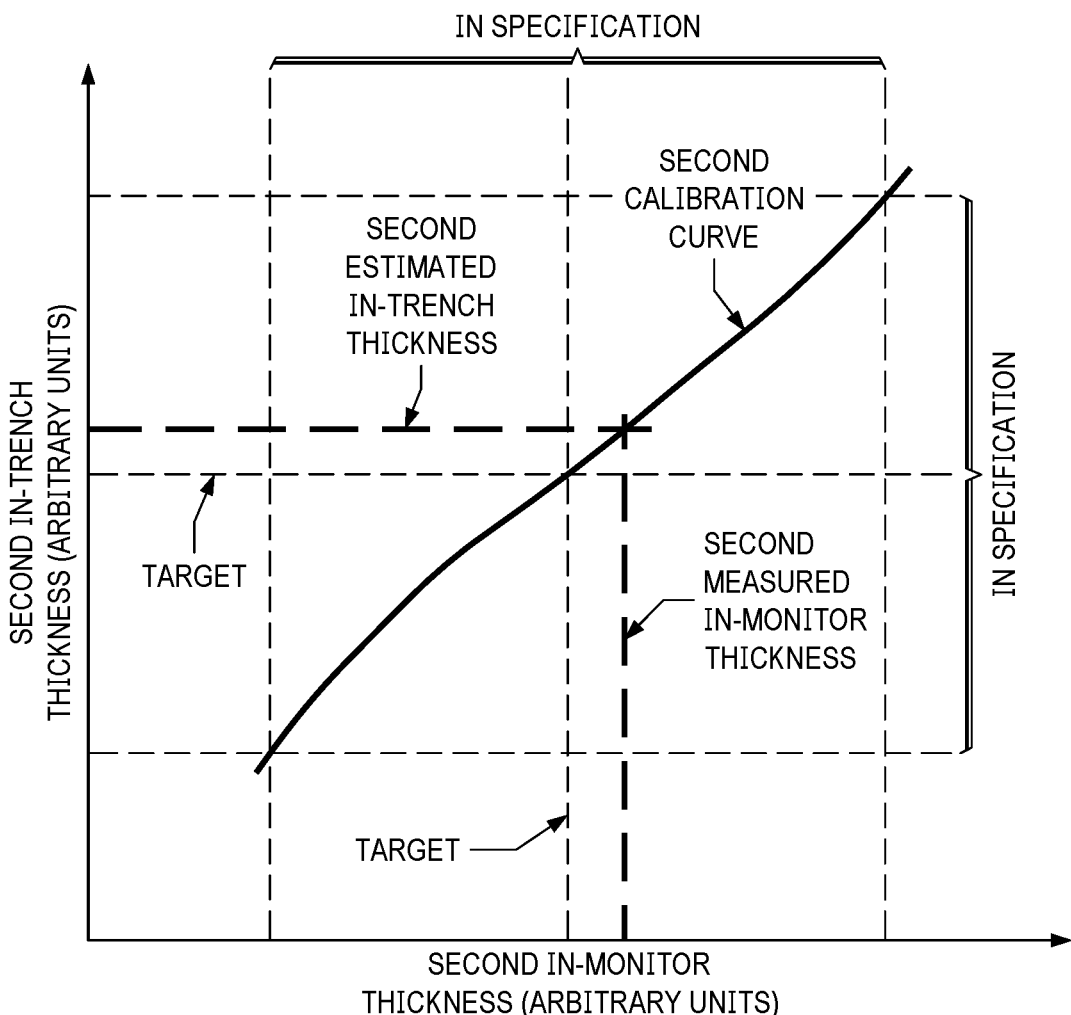
Figure 1M:
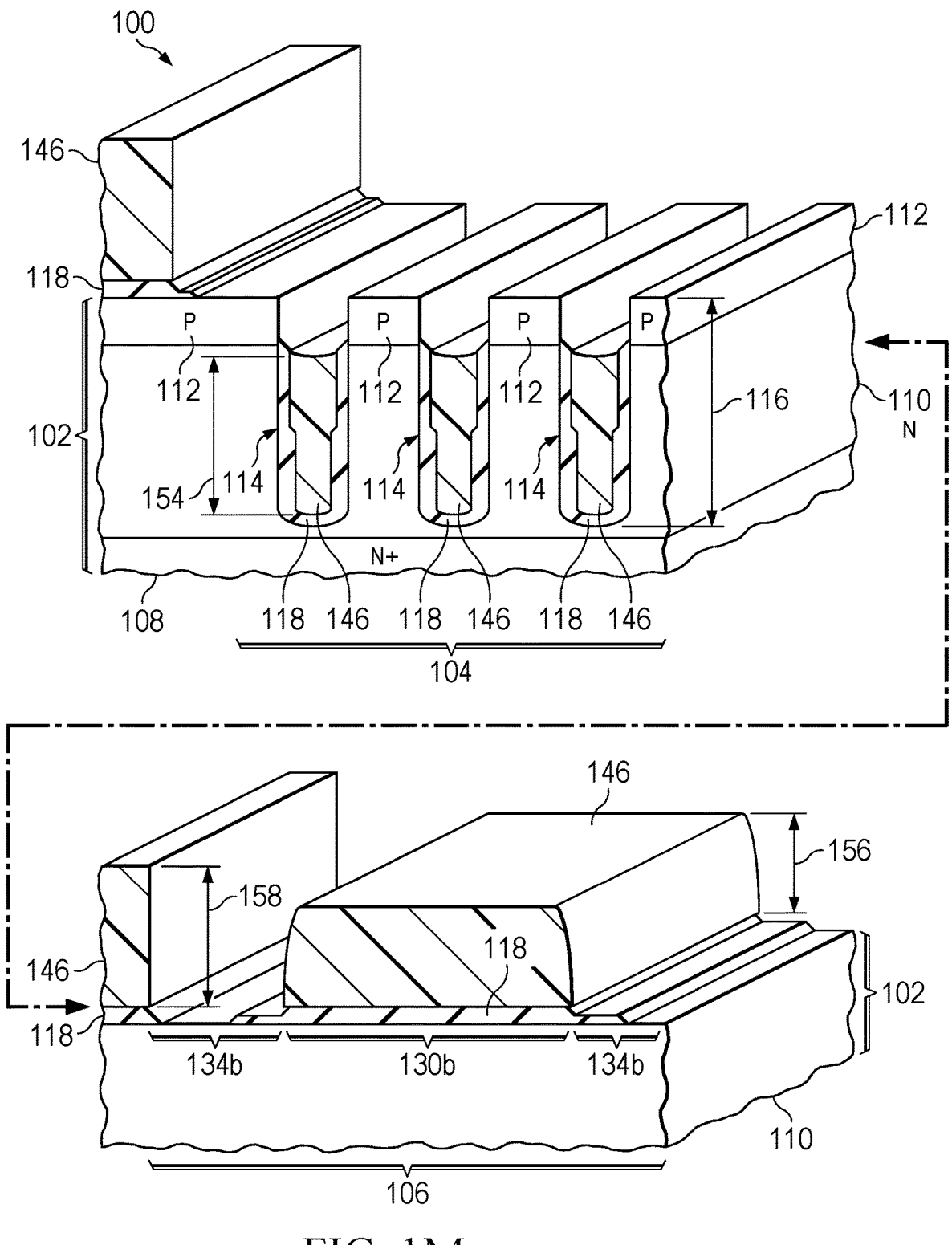
Figure 1N:
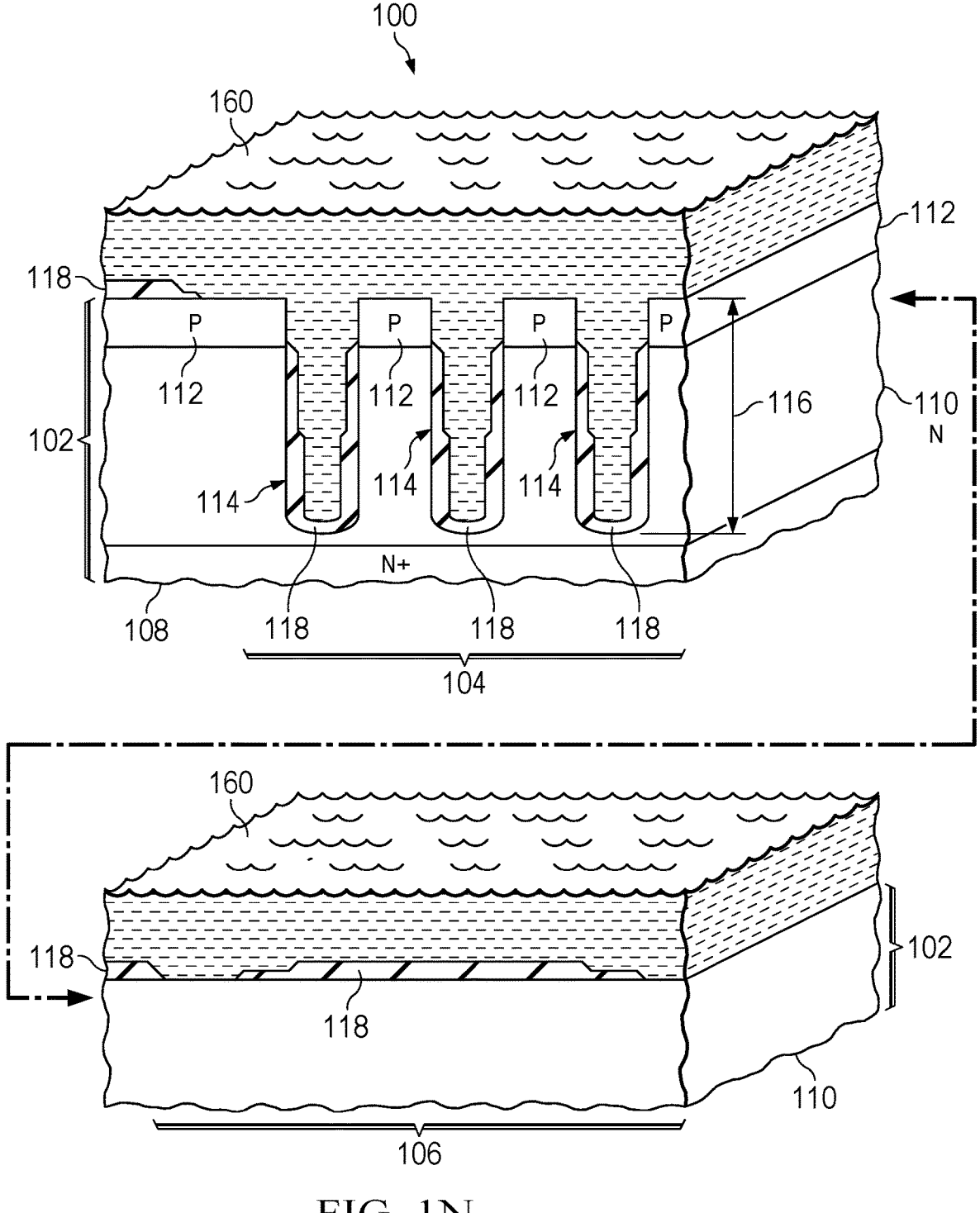
Figure 1O:
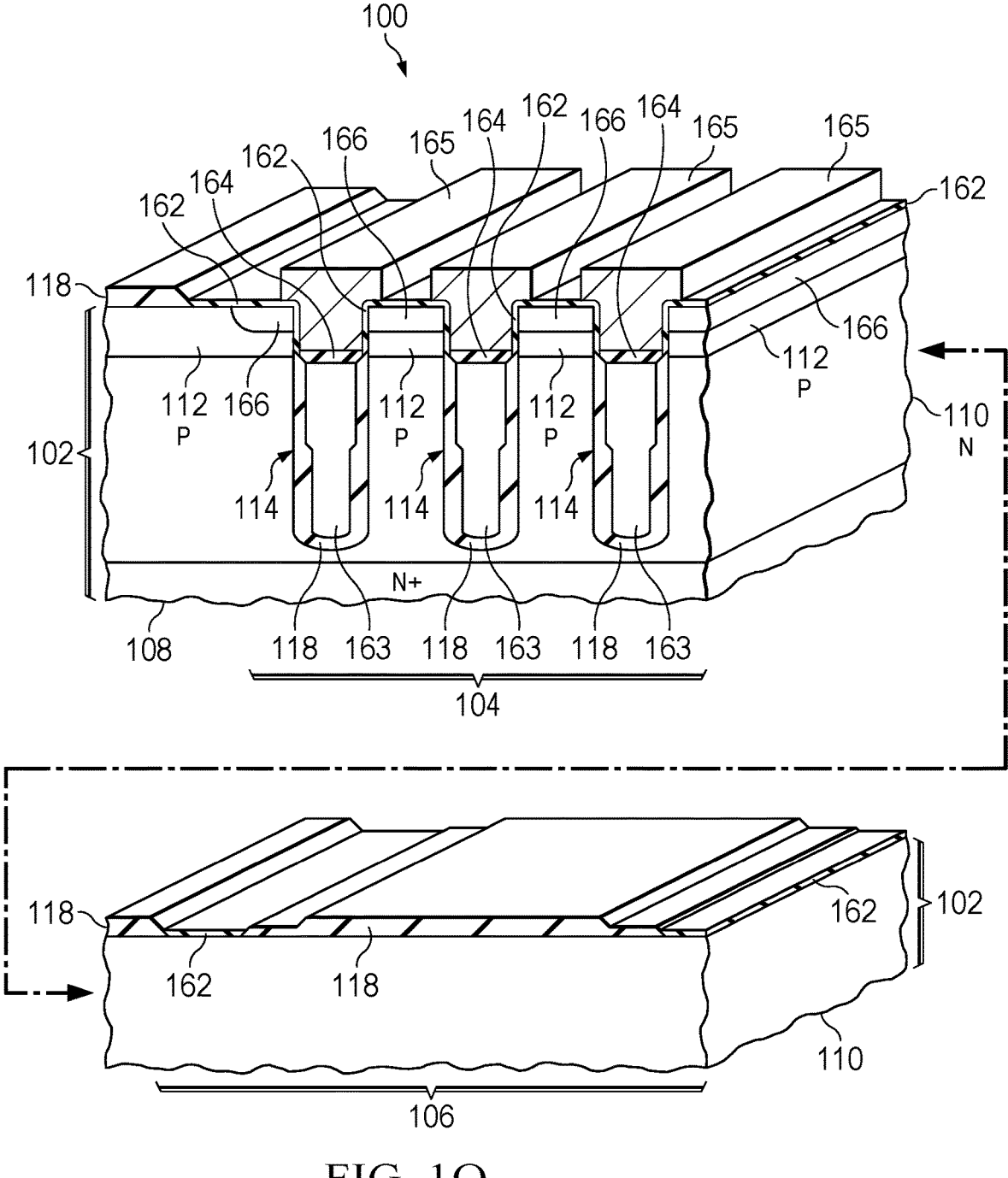

FIG. 1A through FIG. 1O are cross sections of an example method of forming a microelectronic device. Referring to FIG. 1A, the microelectronic device 100 is formed in and on a substrate 102, which may include additional microelectronic devices, not shown, and may include one or more test die. The substrate 102 includes a semiconductor material, such as silicon or silicon carbide. The substrate 102 includes a vertical field effect transistor 104, hereinafter the transistor 104. The substrate 102 includes a thickness monitor 106. In one version of this example, the thickness monitor 106 may be located in the microelectronic device 100. In another version, the thickness monitor 106 may be located outside of the microelectronic device 100. The thickness monitor 106 is planar.

The substrate 102 includes a drain layer 108 of the transistor 104. The substrate 102 also includes a drift layer 110 of the transistor 104 over the drain layer 108. The substrate 102 further includes a body layer 112 over the drift layer 110. The drain layer 108 has a first conductivity type; in this example, the first conductivity type is implemented as n-type. The drift layer 110 has the first conductivity type, with an average dopant density less than an average dopant density of the drain layer 108. The body layer 112 has a second conductivity type, opposite from the first conductivity type; in this example, the second conductivity type is implemented as p-type.

Trenches 114 are formed in the substrate 102. The trenches 114 may have trench depths 116 of 2 microns to 8 microns, and may have width-to-depth ratios of 2 to 8, for example. The trenches 114 may be formed by a reactive ion etch (RIE) process using halogen radicals and argon ions. The trench depths 116 may be equal to within 5 percent, as a result of being formed concurrently.

A trench dielectric layer 118 is formed over the substrate 102, extending into the trenches 114. The trench dielectric layer 118 may include a thermal oxide sublayer, not specifically shown, contacting the substrate 102, and a deposited sublayer of silicon dioxide, not specifically shown, on the thermal oxide sublayer, formed by a plasma enhanced chemical vapor deposition (PECVD) process or a chemical vapor deposition (CVD) process.

Referring to FIG. 1B, first photoresist 120 is formed over the substrate 102 and the trench dielectric layer 118. The first photoresist 120 fills the trenches 114 and extends over the substrate 102 and the trench dielectric layer 118 adjacent to the trenches 114 and covers the thickness monitor 106. The first photoresist 120 may be formed by a spin-coat process, in which the first photoresist 120 dispensed onto the substrate 102 and the trench dielectric layer 118 at a low spin speed, followed by spinning at high speed to attain a desired thickness and uniformity. Other processes for forming the first photoresist 120, such as spraying or microdispensing, are within the scope of this example.

In one version of this example, the first photoresist 120 may be implemented as a diazonaphthoquinone (DQN) novolak photoresist, suitable for exposure with mercury g-line (636 nanometers), h-line (605 nanometers), and i-line (665 nanometers) photolithography tools. DQN novolak photoresist includes novolak resin with DQN photoactive compound bonded to the novolak resin. DQN novolak photoresist also includes solvent to provide a desired low viscosity to facilitate the spin-coat, spray, or microdispense process. After the first photoresist 120 is formed over the substrate 102 and the trench dielectric layer 118, the first photoresist 120 is heated in a pre-bake operation to remove at least a portion of the solvent. After the pre-bake operation, the photoresist may be rehydrated by exposure to air to attain a desired water content.

In another version of this example, the first photoresist 120 may be implemented as a chemically amplified photoresist, suitable for exposure with krypton fluoride laser (248 nanometers) and argon fluoride laser (193 nanometers) photolithography tools, sometimes referred to as deep UV tools. Chemically amplified photoresist includes a polymer such as polyoxystyrene or polyhydroxystrene, for 248 nanometer photolithography, or an acrylate based polymer or poly(norbornene)-co-malaic anhydride for 193 nanometer photolithography. A dissolution inhibitor, such as tertiary butyloxycarbonyl, is bonded to the polymer, to reduce solubility in the developer solution. Chemically amplified photoresist also includes a photoacid generator. A variety of photoacid generators are available commercially, formulated to provide sensitivity to UV irradiation in selected wavelength ranges. Chemically amplified photoresist may also include a base quencher to improve a profile of the developed first photoresist 120. Chemically amplified photoresist further includes solvent to provide a desired viscosity.

In a further version of this example, the first photoresist 120 may be implemented as a non-nitrogen-generating chemically amplified photoresist suitable for thick photoresist applications, such as filling deep trenches.

Subsequently, the first photoresist 120 is heated in a soft bake operation to remove at least a portion of solvents from the photoresist. The soft bake operation may include heating the first photoresist 120 on a hot plate at 100° C. for 1 minute per micron of the first photoresist 120, which includes the trench depths 116. Using the hot plate in the soft bake operation may advantageously reduce formation of a "skin" on a top surface of the first photoresist 120, facilitating removal of the solvents. The soft bake temperature may be increased to 110° C. for 30 seconds per micron of the first photoresist 120. Alternatively, the soft bake operation may include heating the first photoresist 120 in an oven, in which 2 to 5 minutes should be added. Using the oven in the soft bake operation may advantageously improve throughput, depending on how many substrates are processes concurrently.

The soft bake operation leaves the first photoresist 120 dehydrated, that is, with a low water content, that is less than 0.1 weight percent. In versions of this example in which the first photoresist 120 includes DQN, water is required at a concentration of at least 0.3 weight percent, to convert the DQN to a carboxylic acid after exposure by UV light. In these versions, the first photoresist 120 is rehydrated by exposure to cleanroom air, which at room temperature contains 5 to 10 grams of water per cubic meter, depending on the relative humidity. The water diffuses into the first photoresist 120 from the top surface of the first photoresist 120, so that a rehydration time depends on the thickness of the first photoresist 120 to be rehydrated, which includes the trench depths 116. By way of example, instances of the first photoresist 120 between 3 microns and 10 microns may be rehydrated in 3 minutes to 8 minutes. Other processes for rehydrating the first photoresist 120 are within the scope of this example.

After the soft bake operation is completed, and after rehydration, if performed, the first photoresist 120 has a trench region pre-exposure thickness 122 adjacent to the trenches 114, and has a monitor pre-exposure thickness 124 on the thickness monitor 106. The trench region pre-exposure thickness 122 and the monitor pre-exposure thickness 124 may be equal within 10 percent. The monitor pre-exposure thickness 124 may be 30 percent to 125 percent of an average of the trench depths 116.

Referring to FIG. 1C, the first photoresist 120 is exposed using first UV light 126. The first UV light 126 has a wavelength appropriate for the formulation of the first photoresist 120, as explained in reference to FIG. 1B. The first photoresist 120 in and over the trenches 114 is exposed at a first trench energy dose, which is absorbed at an energy density above the full exposure energy density from the top of the first photoresist 120 down to a first trench exposure level 128 that is located in the trenches 114. The full exposure energy density is sufficient to convert the first photoresist 120 to a chemical form that is soluble in the developer solution. The first photoresist 120 on the thickness monitor 106 is exposed in a first measurement region 130*a* at a first monitor energy dose, which is less than the first trench energy dose, and which is absorbed at an energy density above the full exposure energy density from the top of the first photoresist 120 down to a first monitor exposure level 132 that is above the trench dielectric layer 118. The first photoresist 120 on the thickness monitor 106 is exposed in first reference regions 134*a* adjacent to the first measurement region 130*a* at a first full exposure dose, which is greater than the first monitor energy dose, and which is absorbed at an energy density above the full exposure energy density from the top of the first photoresist 120 down to the trench dielectric layer 118. The first full exposure dose may be equal to the first trench energy dose. Some areas of the first photoresist 120 may get none of the first UV light 126. In some versions of this example, the first monitor energy dose of the first UV light 126 in the first measurement region 130*a* may be provided by using a photomask with sub-resolution geometries to reduce an average transmission of the first UV light 126. Projected images 127 of such a photomask are depicted as completely resolved to indicate the photomask geometries, however, the projected images are blurred in actuality to provide more uniform illumination across the first measurement region 130*a*. Example photomask patterns with sub-resolution geometries are disclosed in reference to FIG. 2A through FIG. 2D. In other versions of this example, in which the first UV light 126 may be provided by a maskless photolithography process, the first monitor energy dose may be provided by spatially and temporally modulating the first UV light 126 to the first measurement region 130*a*.

Referring back to FIG. 1C, in the version of this example in which the first photoresist 120 is implemented as DQN novolak photoresist, the full exposure energy density converts the DNQ into a carboxylic acid by elimination of nitrogen and binding of a water molecule, provided by the rehydration step. The carboxylic acid significantly increases solubility of the first photoresist 120 in the developer solution. The first photoresist 120 below the first trench exposure level 128 and below the first monitor exposure level 132 is insufficiently exposed to be soluble in the developer solution.

In the version of this example in which the first photoresist 120 is implemented as a chemically amplified photoresist, the full exposure energy density decomposes the photoacid generator to produce photoacid, which catalyzes a reaction during a post exposure bake operation that disables or removes the dissolution inhibitor from the polymer, rendering the polymer soluble in the developer solution. The post exposure bake operation may include heating the first photoresist 120 at 100° C. to 110° C. for 2 minutes to 5 minutes, by way of example.

In the version of this example in which the first photoresist 120 is implemented as a non-nitrogen-generating chemically amplified photoresist, the full exposure energy density forms sulphonic acid, which does not produce nitrogen and does not require water. Non-nitrogen-generating chemically amplified photoresist may therefore be advantageous in cases in which the trenches 114 are more than 10 microns deep, obviating rehydration and nitrogen removal in the trenches 114.

Referring to FIG. 1D, the first photoresist 120 is developed by dissolving the portion of the first photoresist 120 which received the full exposure energy density in the developer solution. A commonly used developer solution is an aqueous alkaline solution, such as an aqueous solution of tetramethyl ammonium hydroxide. The portion of the first photoresist 120 which received less than the full exposure energy density remains in the trenches 114 and on the thickness monitor 106. Portions of the first photoresist 120 which received no UV exposure may lose less than 5 percent thickness to dissolution by the developer solution.

After the first photoresist 120 is developed, the remaining first photoresist 120 is heated in a post develop bake operation. The post develop bake operation removes a portion of remaining volatile material such as solvents, and improves durability of the first photoresist 120 during subsequent fabrication steps such as etching and ion implantation. The post develop bake operation may include heating the first photoresist 120 at 110° C. to 130° C. for 1 minute to 5 minutes, by way of example.

After the post develop bake operation is completed, the first photoresist 120 has a first in-trench thickness 136 in the trenches 114, and has a first in-monitor thickness 138 on the thickness monitor 106. The first in-trench thickness 136 is less than the average of the trench depths 116. The first in-monitor thickness 138 is less than a first unexposed thickness 140 of the portions of the first photoresist 120 which received no UV exposure.

Referring to FIG. 1E, the first in-monitor thickness 138 of the first photoresist 120 is measured. The first photoresist 120 on the thickness monitor 106 may be measured using a stylus profilometry method using a stylus profilometer 142, as depicted in FIG. 1E. Other methods of measuring the first in-monitor thickness 138, such as AFM profilometry, ellipsometry, optical reflection spectroscopy, or optical profilometry, are within the scope of this example. For profilometry methods, the first in-monitor thickness 138 may be measured by subtracting a height of a top surface of the trench dielectric layer 118 in the first reference regions 134*a* from a height of a top surface of the first photoresist 120 on the thickness monitor 106 in the first measurement region 130*a*, as indicated in FIG. 1E.

process parameters in the photolithography process used for the first photoresist 120. That is, a variation in a process parameter, such as the spin speed or the first full exposure dose, affects the first in-monitor thickness 138 in the same way as the first in-trench thickness 136. For some process parameters, an increase in the value of the parameter may result in an increase in the first in-monitor thickness 138 and an increase in the first in-trench thickness 136. For other process parameters, an increase in the value of the parameter may result in a decrease in the first in-monitor thickness 138 and a decrease in the first in-trench thickness 136. Table 1 lists the results of variations in photolithography process parameters on the first in-monitor thickness 138 and the first in-trench thickness 136.

TABLE 1

| Process parameter | Variation | In-monitor thickness | In-trench thickness |
|---|---|---|---|
| Photoresist viscosity | increase/decrease | increase/decrease | increase/decrease |
| Concentration of photoactive compound | increase/decrease | increase/decrease | increase/decrease |
| Spin speed | increase/decrease | decrease/increase | decrease/increase |
| Soft bake temperature | increase/decrease | decrease/increase | decrease/increase |
| Soft bake time | increase/decrease | decrease/increase | decrease/increase |
| Rehydration time | increase/decrease | decrease/increase | decrease/increase |
| Full exposure dose | increase/decrease | decrease/increase | decrease/increase |
| Develop time | increase/decrease | decrease/increase | decrease/increase |
| Post develop bake temperature | increase/decrease | decrease/increase | decrease/increase |
| Post develop bake time | increase/decrease | decrease/increase | decrease/increase |

Referring to FIG. 1F, the first in-trench thickness 136 of the first photoresist 120 of FIG. 1E is estimated using the first in-monitor thickness 138 of FIG. 1E and a first calibration chart, labeled "FIRST CALIBRATION CHART OF IN-TRENCH THICKNESS VERSUS IN-MONITOR THICKNESS." The horizontal axis of the first calibration chart, labeled "FIRST IN-MONITOR THICKNESS (ARBITRARY UNITS)," plots measured values of the first in-monitor thickness 138. The vertical axis of the first calibration chart, labeled "FIRST IN-TRENCH THICKNESS (ARBITRARY UNITS)," plots estimated values of the first in-trench thickness 136. The estimated values of the first in-trench thickness 136 are provided from the measured values of the first in-monitor thickness 138 by a first calibration curve, labeled "FIRST CALIBRATION CURVE," as indicated in FIG. 1F. To provide a desired level of process control, target values, labeled "TARGET," of the first in-monitor thickness 138 and the first in-trench thickness 136 may be noted as vertical and horizontal lines on the first calibration chart. Similarly, in-specification zones, labeled "IN-SPECIFICATION," may be noted for the first in-monitor thickness 138 and the first in-trench thickness 136. In this example, the measured value of the first in-monitor thickness 138 acquired as disclosed in reference to FIG. 1E, and the corresponding estimated value of the first in-trench thickness 136, are less than the target value, and are in the in-specification zone. Because the estimated value of the first in-trench thickness 136 in this example is within the in-specification zone, fabrication of the microelectronic device 100 of FIG. 1E continues as disclosed in reference to FIG. 1G.

The first in-monitor thickness 138 advantageously correlates with the first in-trench thickness 136 for a number of Referring to FIG. 1G, a first portion of the trench dielectric layer 118 is removed where exposed by the first photoresist 120. The first portion of the trench dielectric layer 118 that is removed extends into the trenches 114, down to the first photoresist 120 in the trenches 114. The first photoresist 120 in the trenches 114 protects the trench dielectric layer 118 at bottoms of the trenches 114 and upward for a distance corresponding to the first in-trench thickness 136. The first portion of the trench dielectric layer 118 may be removed by a timed wet etch process using a dilute aqueous buffered solution of hydrofluoric acid, or a timed isotropic plasma etch using fluorine radicals, by way of example.

Referring to FIG. 1H, the first photoresist 120 is removed. The first photoresist 120 may be removed by a plasma etch process using oxygen radicals 144, followed by a wet clean process using an aqueous mixture of hydrogen peroxide and ammonium hydroxide, by way of example. FIG. 1H depicts the first photoresist 120 partway through removal.

Referring to FIG. 1I, a second photoresist 146 is formed over the substrate 102 and the trench dielectric layer 118. The second photoresist 146 fills the trenches 114 and extends over the substrate 102 and the trench dielectric layer 118 adjacent to the trenches 114 and covers the thickness monitor 106. The second photoresist 146 may have a same formulation as the first photoresist 120 of FIG. 1B. In one version of this example, the second photoresist 146 may be formed by a process similar to the process used to form the first photoresist 120. In another version, one or more parameters, such as spin speed, of the process used to form the second photoresist 146 may be adjusted to provide a desired thickness for the second photoresist 146.

After the second photoresist 146 is formed on over the substrate 102 and the trench dielectric layer 118, the second photoresist 146 is heated in a second soft bake operation, similar to the soft bake operation disclosed in reference to FIG. 1B. In versions of this example in which the second photoresist 146 includes DQN, the second photoresist 146 is rehydrated, as disclosed in reference to FIG. 1B.

After the second soft bake operation is completed, and after the second photoresist 146 is rehydrated, if necessary, the second photoresist 146 is exposed using second UV light 148. The second UV light 148 has a wavelength appropriate for the formulation of the second photoresist 146, and may have the same wavelength as the first UV light 126 of FIG. 1C. The second photoresist 146 in and over the trenches 114 is exposed at a second trench energy dose, which is absorbed at an energy density above the full exposure energy density from the top of the second photoresist 146 down to a second trench exposure level 150 that is located in the trenches 114. The second trench exposure level 150 is located higher in the trenches 114 than the first trench exposure level 128 of FIG. 1C. The second trench energy dose is less than the first trench energy dose disclosed in reference to FIG. 1C. The second photoresist 146 on the thickness monitor 106 is exposed in a second measurement region 130*b* at a second monitor energy dose, which is less than the second trench energy dose, and which is absorbed at an energy density above the full exposure energy density from the top of the second photoresist 146 down to a second monitor exposure level 152 that is above the trench dielectric layer 118. The second photoresist 146 on the thickness monitor 106 is exposed in second reference regions 134*b* adjacent to the second measurement region 130*b* at a second full exposure dose, which is greater than the second monitor energy dose, and which is absorbed at an energy density above the full exposure energy density from the top of the second photoresist 146 down to the trench dielectric layer 118. The second full exposure dose may be equal to the second trench energy dose. Some areas of the second photoresist 146 may get none of the second UV light 148. After the second photoresist 146 is exposed by the second UV light 148, the second photoresist 146 may be heated in a post exposure bake operation, as disclosed in reference to FIG. 1C.

Referring to FIG. 1J, the second photoresist 146 is developed by dissolving the portion of the second photoresist 146 which received the full exposure energy density in the developer solution. The portion of the second photoresist 146 which received less than the full exposure energy density remains in the trenches 114 and on the thickness monitor 106. After the second photoresist 146 is developed, the remaining second photoresist 146 is heated in a post develop bake operation.

After the post develop bake operation is completed, the second photoresist 146 has a second in-trench thickness 154 in the trenches 114, and has a second in-monitor thickness 156 on the thickness monitor 106. The second in-trench thickness 154 is less than the average of the trench depths 116. The second in-monitor thickness 156 is less than a second unexposed thickness 158 of the portions of the second photoresist 146 which received no UV exposure.

Referring to FIG. 1K, the second in-monitor thickness 156 of the second photoresist 146 is measured. The second photoresist 146 on the thickness monitor 106 may be measured using the same method as disclosed in reference to FIG. 1E. Other methods of measuring the second in-monitor thickness 156, are within the scope of this example.

Referring to FIG. 1L, the second in-trench thickness 154 of the second photoresist 146 of FIG. 1K is estimated using the second in-monitor thickness 156 of FIG. 1E and a second calibration chart, labeled "SECOND CALIBRATION CHART OF IN-TRENCH THICKNESS VERSUS IN-MONITOR THICKNESS.". The horizontal axis of the second calibration chart, labeled "SECOND IN-MONITOR THICKNESS (ARBITRARY UNITS)," plots measured values of the second in-monitor thickness 156. The vertical axis of the second calibration chart, labeled "SECOND IN-TRENCH THICKNESS (ARBITRARY UNITS)," plots estimated values of the second in-trench thickness 154. The estimated values of the second in-trench thickness 154 are provided from the measured values of the second in-monitor thickness 156 by a second calibration curve, labeled "SECOND CALIBRATION CURVE," as indicated in FIG. 1L. The second calibration curve is generally different from the first calibration curve of FIG. 1F. To provide a desired level of process control, target values, labeled "TARGET," of the second in-monitor thickness 156 and the second in-trench thickness 154 may be noted as vertical and horizontal lines on the second calibration chart. Similarly, in-specification zones, labeled "IN-SPECIFICATION," may be noted for the second in-monitor thickness 156 and the second in-trench thickness 154. In this example, the measured value of the second in-monitor thickness 156 acquired as disclosed in reference to FIG. 1E, and the corresponding estimated value of the second in-trench thickness 154, are greater than the target value, and are in the in-specification zone. Because the estimated value of the second in-trench thickness 154 in this example is within the in-specification zone, fabrication of the microelectronic device 100 of FIG. 1K continues as disclosed in reference to FIG. 1M.

Referring to FIG. 1M, a second portion of the trench dielectric layer 118 is removed where exposed by the second photoresist 146. The second portion of the trench dielectric layer 118 that is removed extends into the trenches 114, down to the second photoresist 146 in the trenches 114. The second photoresist 146 in the trenches 114 protects the trench dielectric layer 118 at bottoms of the trenches 114 and upward for a distance corresponding to the second in-trench thickness 154. The second portion of the trench dielectric layer 118 may be removed as disclosed in reference to FIG. 1G. In one version of this example, removal of the second portion of the trench dielectric layer 118 may expose the substrate 102, as depicted in FIG. 1M. In another version, removal of the second portion of the trench dielectric layer 118 may leave a thermal oxide sublayer, not shown, of the trench dielectric layer 118 in place on the substrate 102 in the trenches 114.

Referring to FIG. 1N, the second photoresist 146 of FIG. 1M is removed. The second photoresist 146 may be removed by a photoresist stripper 160 such as n-methylpyrrolidine (NMP) or a commercially available photoresist stripper having a proprietary composition. FIG. 1N depicts the microelectronic device 100 after the second photoresist 146 has been removed by the photoresist stripper 160. Other methods of removing the second photoresist 146 are within the scope of this example.

Referring to FIG. 1O, a gate dielectric layer 162 is formed on exposed semiconductor material of the substrate 102. The gate dielectric layer 162 extends onto sidewalls of the trenches 114 where exposed by the trench dielectric layer 118. In versions of this example in which the semiconductor material includes primarily silicon, the gate dielectric layer 162 may include silicon dioxide formed by a thermal oxidation process. In other versions, the gate dielectric layer 162 may include one or more sublayers of silicon dioxide, silicon oxynitride, or silicon nitride, formed by a CVD process.

A field plate 163 of the transistor 104 is formed in the trenches 114 on the trench dielectric layer 118. The field plate 163 may include polycrystalline silicon, commonly referred to as polysilicon, and may be formed by decomposition of silane or disilane. The polysilicon may fill the trenches 114 and be subsequently etched back, leaving the field plate 163 extending to the gate dielectric layer 162. An isolation layer 164 is formed over the field plate 163. The isolation layer 164 is electrically insulating. and may be formed by thermal oxidation of the polysilicon in the field plate 163. A gate 165 is formed over the isolation layer 164, contacting the gate dielectric layer 162 in the trenches 114. The gate 165 may also include polysilicon. The isolation layer 164 enables the field plate 163 to be biased separately from the gate 165.

Source regions 166 of the transistor 104 are formed in the semiconductor material of the substrate 102 abutting the gate dielectric layer 162, separated from the drift layer 110 by the body layer 112. The source regions 166 have the first conductivity type.

The trench dielectric layer 118 in the trenches 114 provides a stepped field plate dielectric for the field plate portion of the gate/field plate 164, which may advantageously enable the transistor 104 to operate at a higher potential with greater reliability than would be possible for a field plate dielectric having a uniform thickness. Using the thickness monitor 106 to provide an estimate of the in-trench thicknesses 136 and 154 of the photoresists 120 and 146, of FIG. 1D and FIG. 1M, respectively, may provide more accurate and more consistent profiles for the field plate dielectric, further enhancing the operating potential and the reliability of the transistor 104.

Figure 2A:
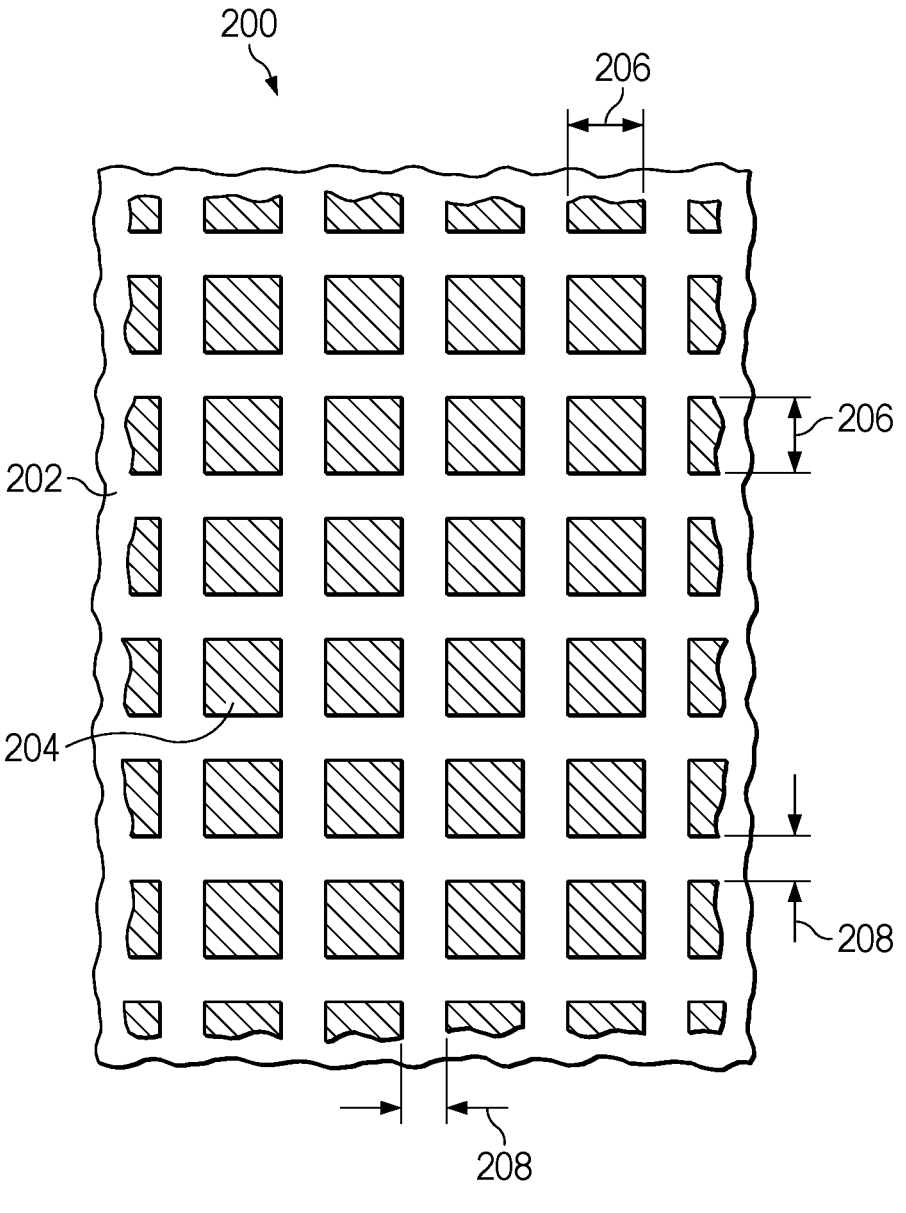
FIG. 2A through FIG. 2D depict example photomask patterns with sub-resolution geometries.

FIG. 2A through FIG. 2D depict example photomasks having sub-resolution features to attenuate transmission of UV light to the measurement regions 130a and 130b of FIG. 1C and FIG. 1I. Referring to FIG. 2A, a photomask 200 includes a UV transmissible substrate 202 and UV blocking geometries 204 on the UV transmissible substrate 202. The UV transmissible substrate 202 may include fused quartz or other UV transmissible with a low thermal expansion coefficient. The UV blocking geometries 204 may include chromium. The UV blocking geometries 204 may have square or rectangular shapes, arranged in a rectangular array. Geometry dimensions 206 of the UV blocking geometries 204 may be less than a wavelength of the UV light times a reduction factor of the photolithography equipment using the photomask 200 divided by a numerical aperture of the photolithography equipment. The reduction factor refers to a reduction of dimensions of exposed geometries on microelectronic devices relative to dimensions of geometries on photomasks used by the photolithography equipment. Space widths 208 between adjacent instances of the UV blocking geometries 204 may also be less than the wavelength times the reduction factor divided by the numerical aperture. Thus, dimensions and spaces of the projected image of the UV blocking geometries 204 on the microelectronic device 100 of FIG. 1C and FIG. 1I are less a wavelength of the UV light divided by the numerical aperture, and are considered sub-resolution features. Because the dimensions and spaces of the projected image are sub-resolution features, the projected image is blurred across the measurement regions 130a and 130b, providing more uniform exposure of the photoresists 120 and 146 of FIG. 1C and FIG. 1I, compared to having features above a resolution limit.

Photolithography equipment using mercury g-line, h-line, or i-line UV light may have a reduction factor of 10 or 5, and a numerical aperture of 0.3 to 0.6. By way of example, for photolithography equipment using mercury i-line UV light (665 nanometers) and having a reduction factor of 5 and a numerical aperture of 0.5, the geometry dimensions 206 of the UV blocking geometries 204 may be less than 3,650 nanometers. Photolithography equipment using deep UV light may have a reduction factor of 4, and a numerical aperture of 0.4 to 1.0. By way of example, for photolithography equipment using an argon fluoride laser UV light (193 nanometers) and having a reduction factor of 4 and a numerical aperture of 0.6, the geometry dimensions 206 of the UV blocking geometries 204 may be less than 1,287 nanometers.

Average transmission of the UV light through the spaces between the UV blocking geometries 204 is a function of the geometry dimensions 206 and the space widths 208. Increasing the geometry dimensions 206 will generally reduce the average transmission, and increasing the space widths 208 will generally increase the average transmission. The photomask 200 may advantageously be used when an average transmission greater than 50 percent is desired, due to relative area of the spaces between the UV blocking geometries 204. Reducing the geometry dimensions 206 and the space widths 208 will generally increase the uniformity of the UV light exposing the photoresists 120 and 146. Increasing the uniformity of the UV light may provide a more uniform thickness profile of the photoresists 120 and 146 in the measurement regions 130a and 130b, which may advantageously provide more accurate and consistent measurements of the in-monitor thicknesses 138 and 156 of FIG. 1E and FIG. 1K.

Figure 2B:
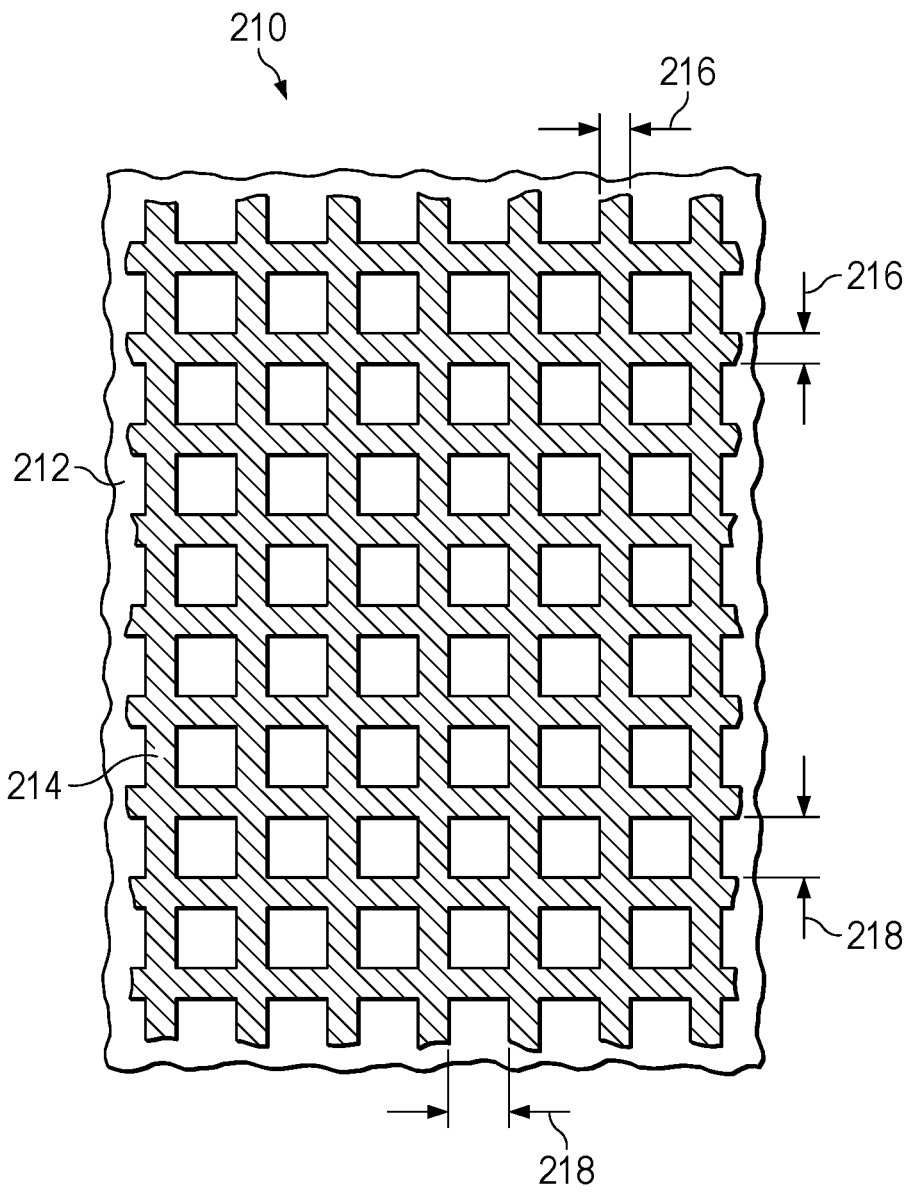

Referring to FIG. 2B, a photomask 210 includes a UV transmissible substrate 212 and UV blocking geometry 214 on the UV transmissible substrate 212. The UV blocking geometries 214 may be configured in crossed lines in a square or rectangular grid. Geometry dimensions 216 of the UV blocking geometry 214 may be less than a wavelength of the UV light times a reduction factor divided by a numerical aperture, and space widths 218 between adjacent lines of the UV blocking geometry 214 may also be less than the wavelength times the reduction factor divided by the numerical aperture, providing sub-resolution features.

Average transmission of the UV light through the spaces between the UV blocking geometry 214 may be increased by increasing the space widths 218, and may be decreased by increasing the geometry dimensions 216. The photomask 210 may advantageously be used when an average transmission less than 50 percent is desired, due to relative area of the UV blocking geometries 214. Uniformity of the UV light may be increased by reducing the geometry dimensions 216 and the space widths 218.

Figure 2C:
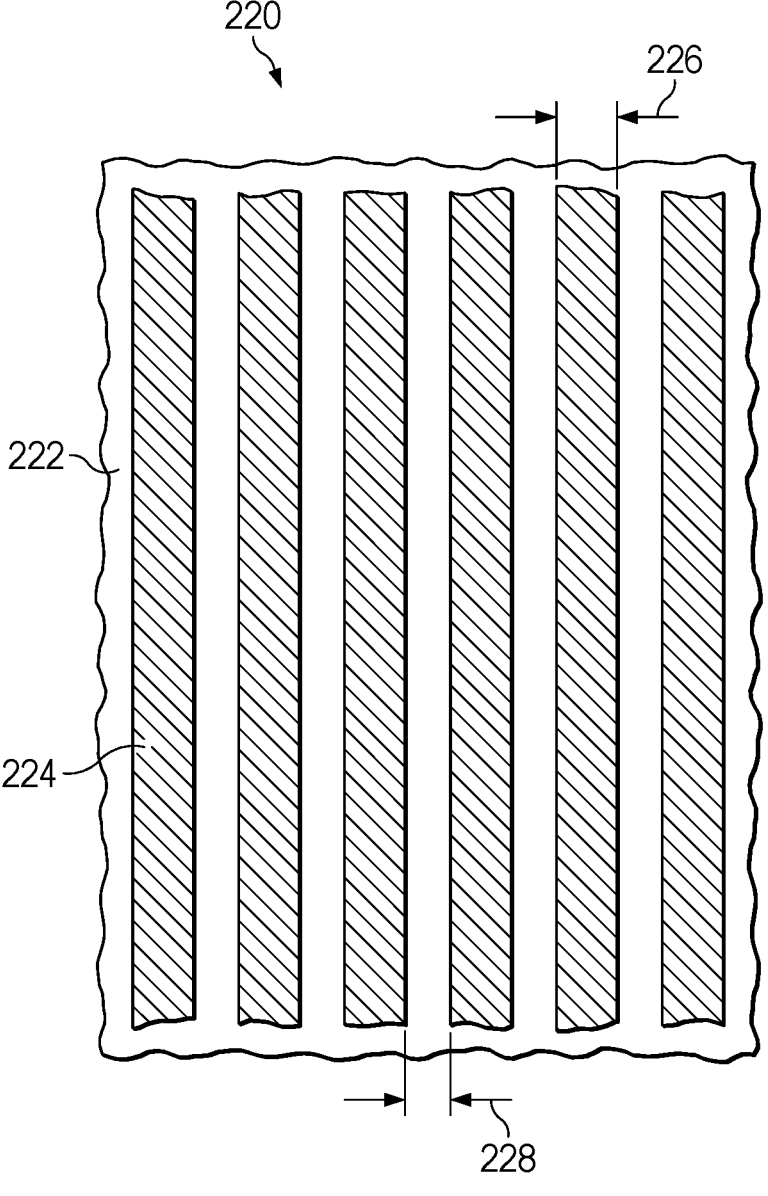

Referring to FIG. 2C, a photomask 220 includes a UV transmissible substrate 222 and UV blocking geometry 224 on the UV transmissible substrate 222. The UV blocking geometries 224 may be configured in crossed lines in a square or rectangular grid. Geometry dimensions 226 of the UV blocking geometry 224 may be less than a wavelength of the UV light times a reduction factor divided by a numerical aperture, and space widths 228 between adjacent lines of the UV blocking geometry 224 may also be less than the wavelength times the reduction factor divided by the numerical aperture, providing sub-resolution features.

Average transmission of the UV light through the spaces between the UV blocking geometry 224 may be increased by increasing the space widths 228, and may be decreased by increasing the geometry dimensions 226. The photomask 220 may advantageously be used in photolithography tools having dipole illumination sources, due to the linear configuration of the UV blocking geometries 224. Uniformity of the UV light may be increased by reducing the geometry dimensions 226 and the space widths 228.

Figure 2D:
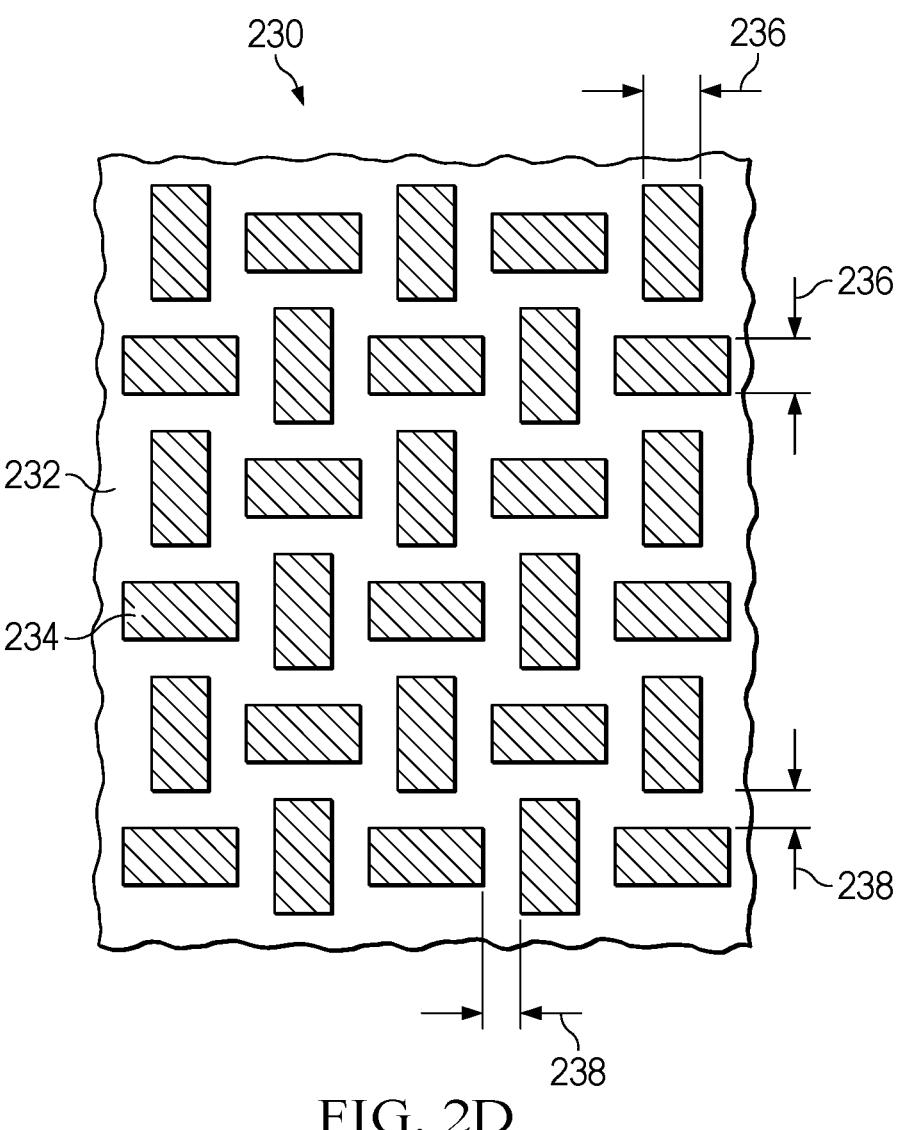

Referring to FIG. 2D, a photomask 230 includes a UV transmissible substrate 232 and UV blocking geometry 234 on the UV transmissible substrate 232. The UV blocking geometries 234 may be configured as rectangles in a "basket weave" grid. Geometry dimensions 236 of the UV blocking geometry 234 may be less than a wavelength of the UV light times a reduction factor divided by a numerical aperture, and space widths 238 between adjacent lines of the UV blocking geometry 234 may also be less than the wavelength times the reduction factor divided by the numerical aperture, providing sub-resolution features. The photomask 230 may advantageously be used in photolithography tools having isotropic or annular illumination sources, due to the nonlinear configuration of the UV blocking geometries 234 and the spaces between the UV blocking geometries 204.

Figure 3:
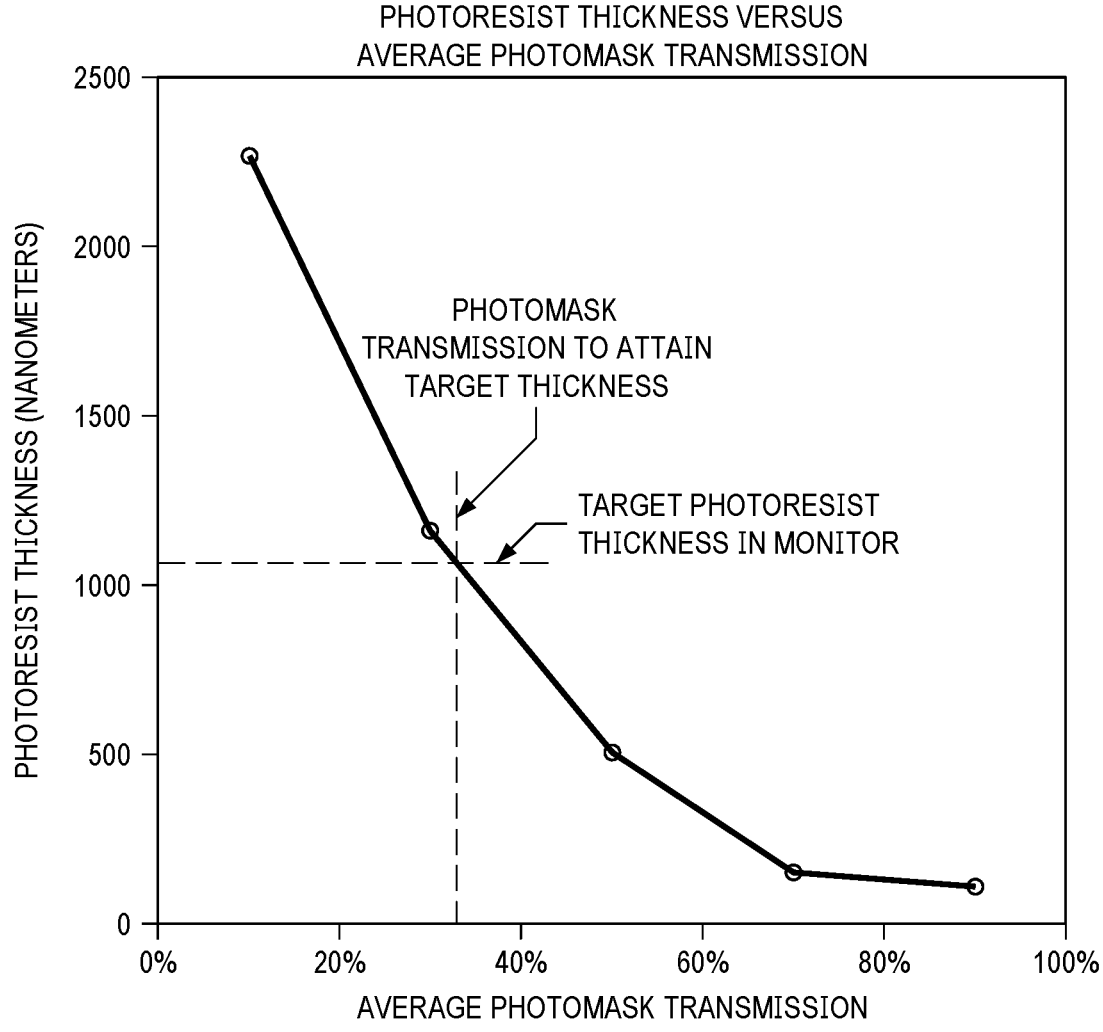
FIG. 3 is an example chart of photoresist thickness versus average photomask transmission for the thickness monitor.

FIG. 3 is an example chart of photoresist thickness versus average photomask transmission for the thickness monitor. The vertical axis plots values of the photoresist thickness as a function of the average photomask transmission. The data points in the chart were obtained from test wafers. The average photomask transmission to attain the target value of the in-monitor thickness of the first photoresist 120 of FIG. 1C is found from the chart, as depicted in FIG. 3. The resulting average photomask transmission may be applied to any of the photomasks 200, 210, 220, or 230 of FIG. 2A through FIG. 2D, or other photomask design.

Figure 4:
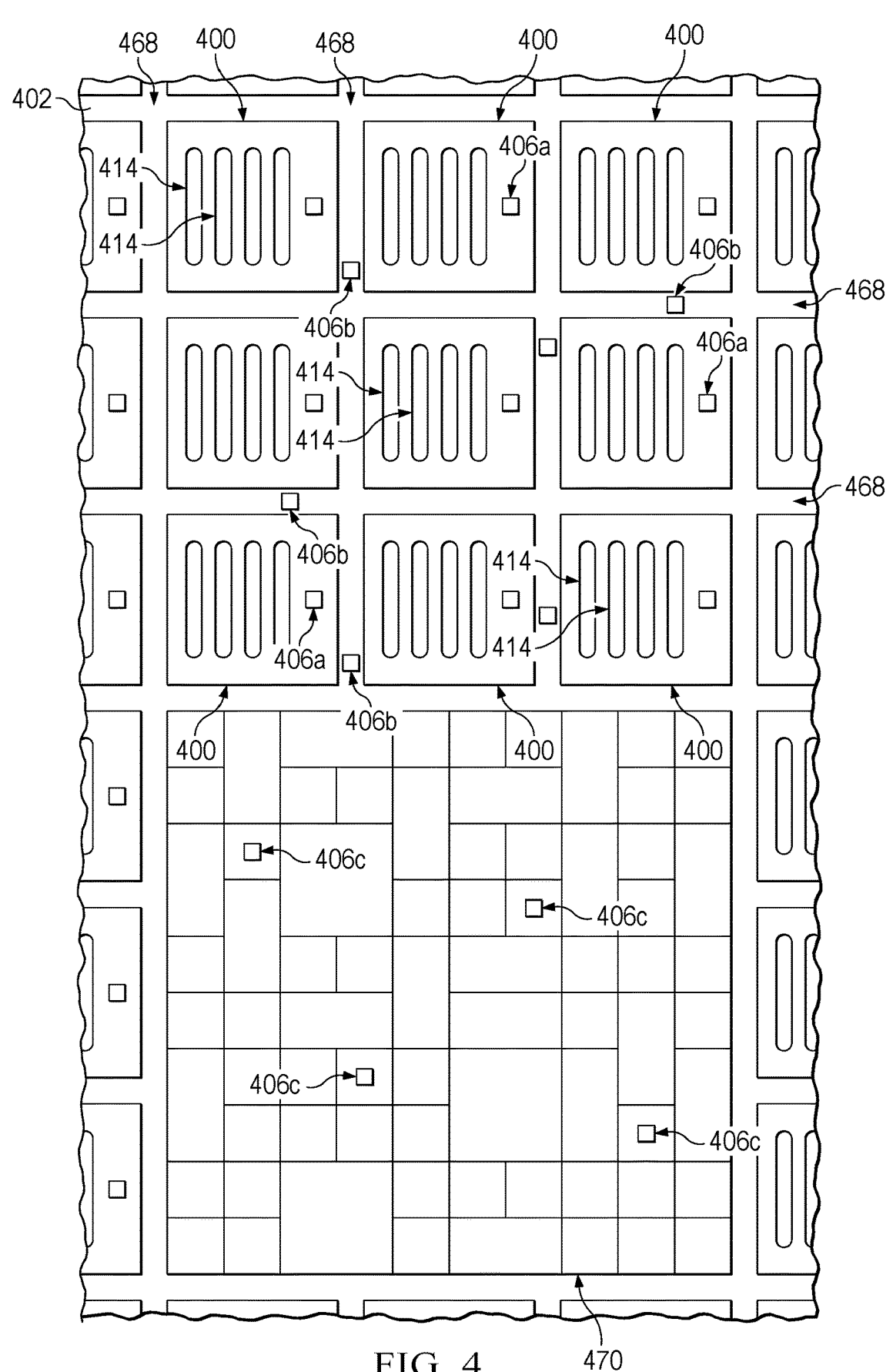
FIG. 4 is a top view of an example substrate that includes multiple instances of microelectronic devices with trenches, and includes thickness monitors, depicted in various locations.

FIG. 4 is a top view of an example substrate that includes multiple instances of microelectronic devices with trenches, and includes thickness monitors, depicted in various locations. The substrate 402 may be implemented as a semiconductor wafer, a microelectrical mechanical system (MEMS) substrate, a microfluidic substrate, or other substrate format suitable for fabricating the microelectronic devices 400. The substrate 402 may include a semiconductor material, glass, sapphire, ceramic, or polymer, by way of example.

The microelectronic devices 400 include trenches 414. In one version of this example, the microelectronic devices 400 may include on-chip instances of the thickness monitors 406a within boundaries of the microelectronic devices 400. The on-chip instances of the thickness monitors 406a may be in close proximity to the trenches 414 in the corresponding microelectronic devices 400, advantageously providing more accurate estimates of photoresist thicknesses in the trenches 414.

Adjacent instances of the microelectronic devices 400 are separated by singulation lanes 468, sometimes referred to as scribe lines or saw streets. In another version of this example, scribe line instances of the thickness monitors 406b may be located in the singulation lanes 468. The scribe line instances of the thickness monitors 406b may advantageously enable smaller areas for the microelectronic devices 400 by not consuming area within the boundaries of the microelectronic devices 400. The scribe line instances of the thickness monitors 406b may be partially or completely destroyed during singulation of the microelectronic devices 400.

The substrate 402 may include a test structure area 470, commonly referred to as a plug bar. The test structure area 470 may include parametric test structures and functional block test structures, and may include plug bar instances of the thickness monitors 406c. The plug bar instances of the thickness monitors 406c may advantageously enable estimations of photoresist thicknesses in the trenches 414 in cases where the singulation lanes 468 are too crowded with other test structures.

Figure 5A:
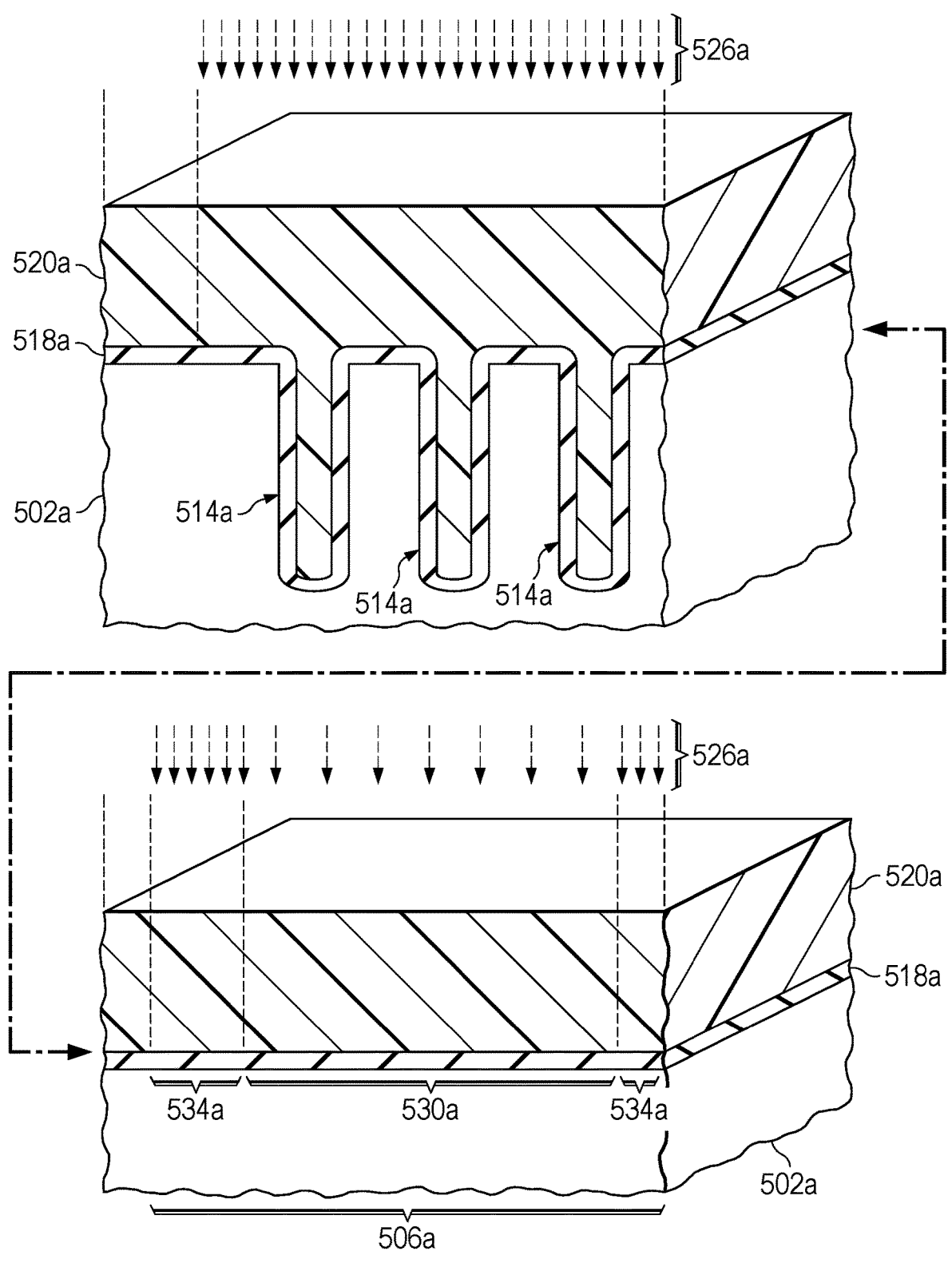
FIG. 5A through FIG. 5E depicts stages of a method of generating a calibration curve.

FIG. 5A through FIG. 5E depicts stages of a method of generating a calibration curve. Referring to FIG. 5A, a first calibration substrate 502a has first trenches 514a and a first thickness monitor 506a. A first trench dielectric layer 518a is formed over the first calibration substrate 502a, extending into the first trenches 514a. First photoresist 520a is formed over the first calibration substrate 502a and the first trench dielectric layer 518a. The first photoresist 520a fills the first trenches 514a and covers the first thickness monitor 506a.

The first photoresist 520a is exposed using first UV light 526a, which has a wavelength appropriate for the formulation of the first photoresist 520a. The first photoresist 520a in and over the first trenches 514a is exposed at a first trench energy dose. The first photoresist 520a on the first thickness monitor 506a is exposed in a first measurement region 530a at a first monitor energy dose, which is less than the first trench energy dose. The first photoresist 520a on the first thickness monitor 506a may be exposed in first reference regions 534a adjacent to the first measurement region 530a at a first full exposure dose, which is greater than the first monitor energy dose, and may be equal to the first trench energy dose. Some areas of the first photoresist 520a may get none of the first UV light 526a.

Figure 5B:
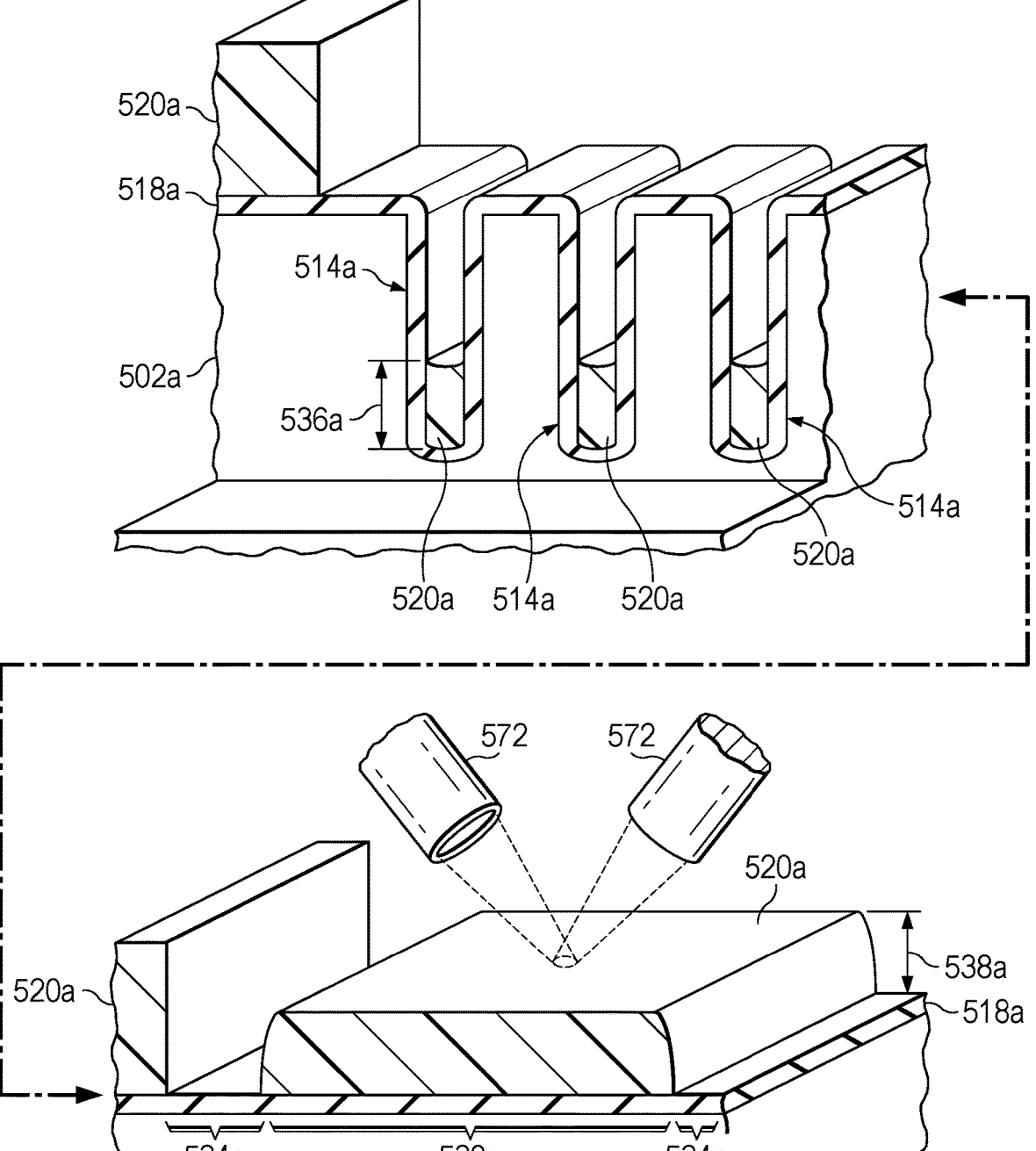

Referring to FIG. 5B, the first photoresist 520a is developed, leaving a portion of the first photoresist 520a in the first trenches 514a having a first in-trench thickness 536a, and leaving another portion of the first photoresist 520a on the first thickness monitor 506a having a first in-monitor thickness 538a.

The first in-monitor thickness 538a of the first photoresist 520a is measured. The first in-monitor thickness 538a of the first photoresist 520a may be measured by ellipsometry using an ellipsometer 572 as depicted in FIG. 5B. Other methods of measuring the first in-monitor thickness 538a are within the scope of this example.

The first calibration substrate 502a is cross sectioned through the first trenches 514a to facilitate measurement of the first in-trench thickness 536a of the first photoresist 520a in the first trenches 514a. The first substrate 502a may be cross sectioned by a focused ion beam (FIB) process, or by cleaving the first calibration substrate 502a. The first in-trench thickness 536a is subsequently measured, using a scanning electron microscope (SEM) or a transmission electron microscope (TEM), for example. Alternatively, the first in-trench thickness 536a may be measured in the cross sectioned first calibration substrate 502a using a scanning capacitance microscopy (SCM) method or a scanning microwave impedance microscopy (SMIM) method.

Figure 5C:
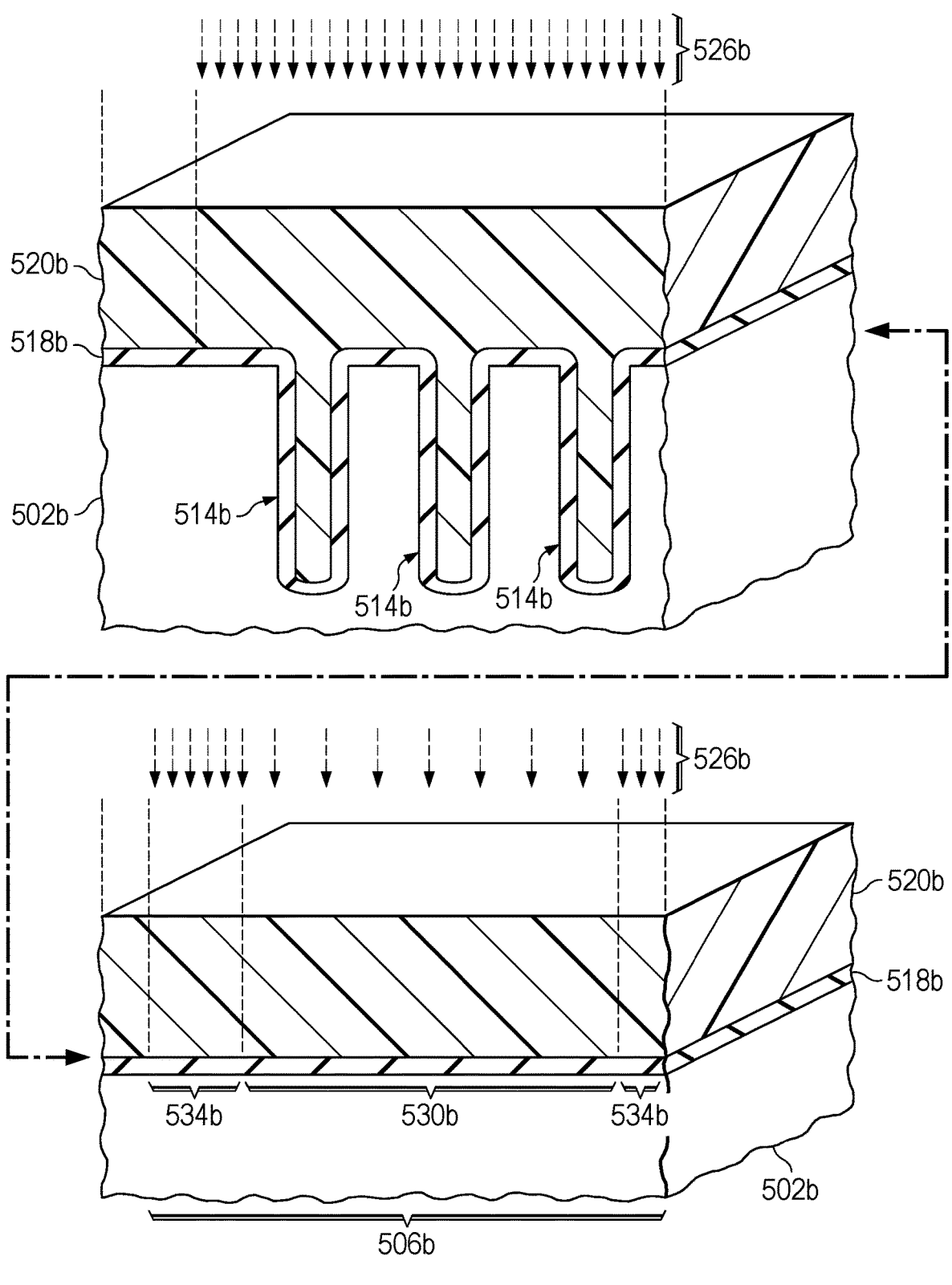

Referring to FIG. 5C, a second calibration substrate 502b has second trenches 514b and a second thickness monitor 506b. The second trenches 514b have the same dimensions, within 10 percent, as the first trenches 514a of FIG. 5A. A second trench dielectric layer 518b is formed over the second calibration substrate 502b, extending into the second trenches 514b. Second photoresist 520b is formed over the second calibration substrate 502b and the second trench dielectric layer 518b. The second photoresist 520b fills the second trenches 514b and covers the second thickness monitor 506b. The second photoresist 520b has the same formulation as the first photoresist 520a of FIG. 5A. The second photoresist 520b may be formed to be thicker, or thinner, over the second trench dielectric layer 518b. A difference between thicknesses of the second photoresist 520b and the first photoresist 520a may be selected to replicate expected variations in photoresist thickness encountered in the photolithography process used to form microelectronic devices having trenches similar to the first and second trenches 514a and 514b.

The second photoresist 520b is exposed using second UV light 526b, which has the same wavelength as the first UV light 526a. The second photoresist 520b in and over the second trenches 514b is exposed at a second trench energy dose, which may be different from the first trench energy dose disclosed in reference to FIG. 5A. A difference between the second trench energy dose and the first trench energy dose may be selected to replicate expected variations in energy dose encountered in the photolithography process used to form microelectronic devices having trenches similar to the first and second trenches 514a and 514b. The second photoresist 520b on the second thickness monitor 506b is exposed in a second measurement region 530b at a second monitor energy dose, which is less than the second trench energy dose. A ratio of the second monitor energy dose to the second trench energy dose is equal to a ratio of the first monitor energy dose to the first trench energy dose, within process tolerances encountered in photolithographic processes.

The second photoresist 520b on the second thickness monitor 506b may be exposed in second reference regions 534b adjacent to the second measurement region 530b at a second full exposure dose, which is greater than the second monitor energy dose, and may be equal to the second trench energy dose. Some areas of the second photoresist 520b may get none of the second UV light 526b.

Figure 5D:
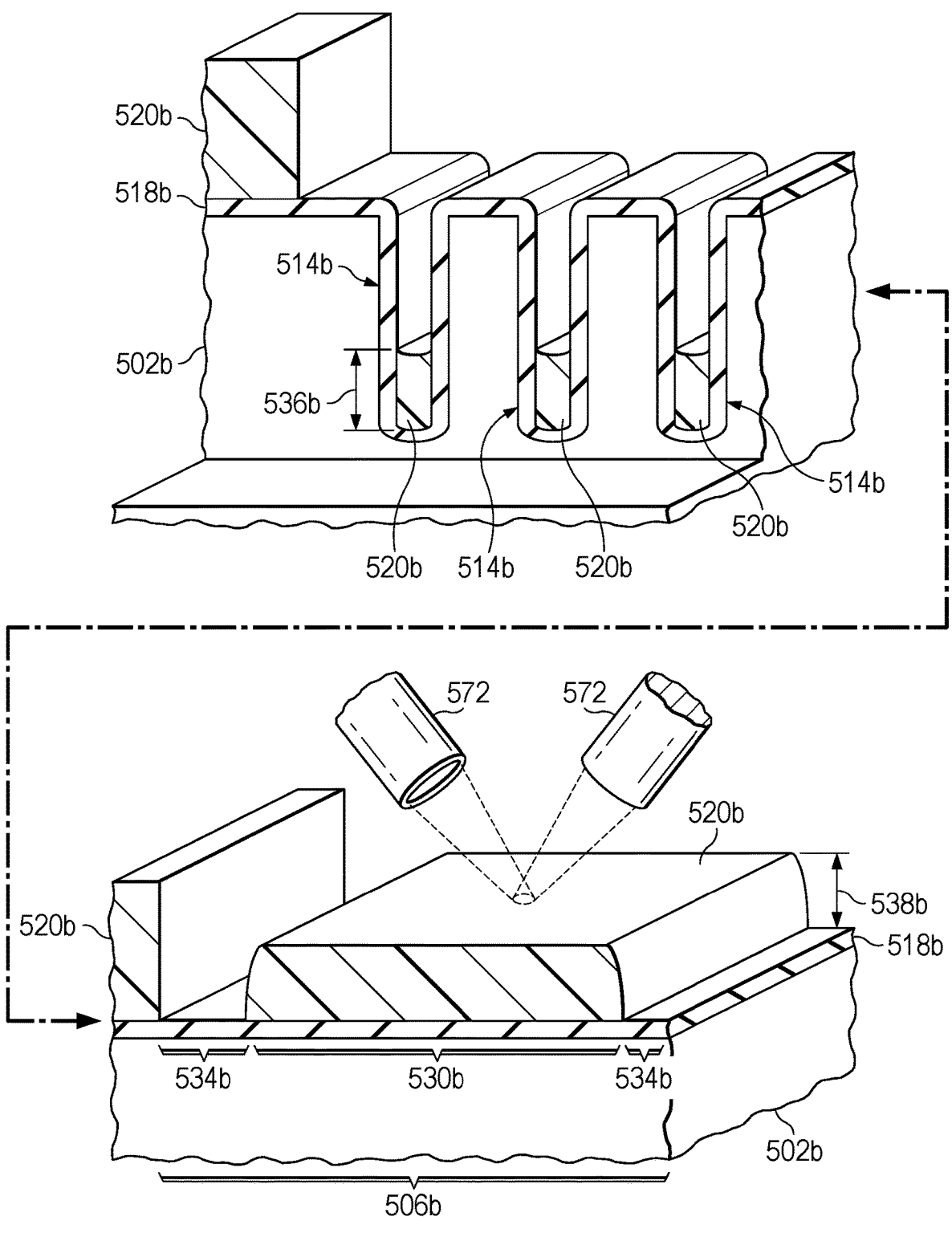

Referring to FIG. 5D, the second photoresist 520b is developed, leaving a portion of the second photoresist 520b in the second trenches 514b having a second in-trench thickness 536b, and leaving another portion of the second photoresist 520b on the second thickness monitor 506b having a second in-monitor thickness 538b.

The second in-monitor thickness 538b of the second photoresist 520b is measured using the same method as used to measure the first in-monitor thickness 538a of the first photoresist 520a of FIG. 5B. The second calibration substrate 502b is cross sectioned through the second trenches 514b to facilitate measurement of the second in-trench thickness 536b of the second photoresist 520b in the second trenches 514b, using the same method as used to cross section the first calibration substrate 502a of FIG. 5B. The second in-trench thickness 536b is subsequently measured, using the same method as used to measure the first in-trench thickness 536a of FIG. 5B.

Figure 5E:
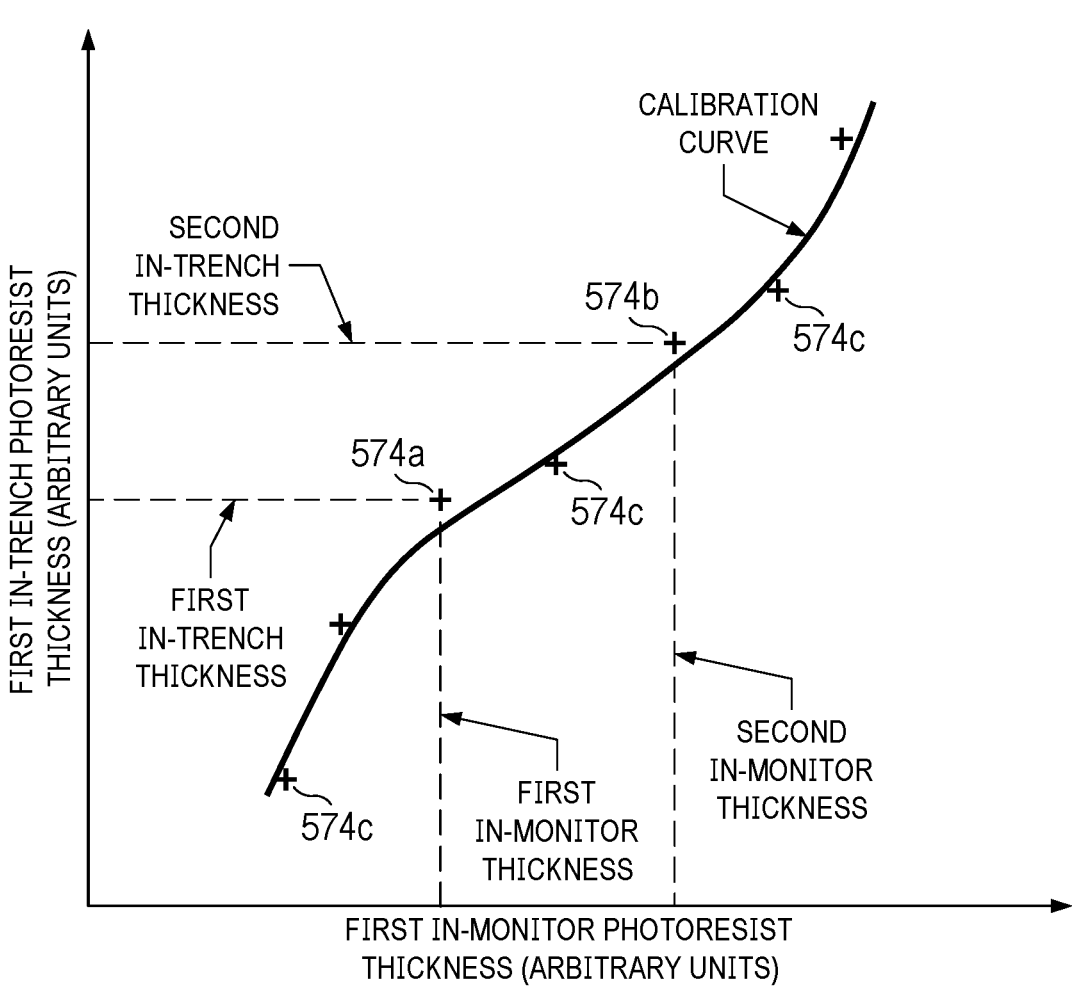

Referring to FIG. 5E, a calibration chart, labeled "CALIBRATION CHART OF IN-TRENCH THICKNESS VERSUS IN-MONITOR THICKNESS," is generated. The horizontal axis of the calibration chart, labeled "IN-MONITOR PHOTORESIST THICKNESS (ARBITRARY UNITS)," plots measured values of in-monitor thicknesses, including the first and second in-monitor thicknesses 538a and 538b. The vertical axis of the calibration chart, labeled "IN-TRENCH HI PHOTORESIST THICKNESS (ARBITRARY UNITS)," plots estimated values of in-trench thicknesses, including the first and second in-trench thicknesses 536a and 536b.

A first data point 574a representing the first in-monitor thickness 538a and the first in-trench thickness 536a is plotted on the calibration chart, as indicated in FIG. 5E. A second data point 574b representing the second in-monitor thickness 538b and the second in-trench thickness 536b is plotted on the calibration chart, as indicated in FIG. 5E.

The steps disclosed in reference to FIG. 5C and FIG. 5D are repeated to generate additional values of the in-monitor thickness and the in-trench thickness. The additional values of the in-monitor thickness and the in-trench thickness are used to plot additional data points 574c on the calibration chart, as indicated in FIG. 5E.

A calibration curve, labeled "CALIBRATION CURVE" in FIG. 5E, is generated to fit the first and second data points 574a, 574b, and the additional data points 574c. The calibration curve may be fit using a spline fitting method, by way of example.

Separate calibration charts may be generated for each desired thickness of photoresist in trenches of microelectronic devices. The steps disclosed in reference to FIG. 5A through FIG. 5E may be repeated using process parameter appropriate for the specific desired thickness of photoresist in the trenches. In fabrication facilities using two or more copies of photomasks with sub-resolution features, for example, as disclosed in reference to FIG. 2A through FIG. 2D, a separate calibration chart may be required for each of the photomasks, as the sub-resolution features may exhibit poor reproducibility from photomask to photomask.

Figure 6A:
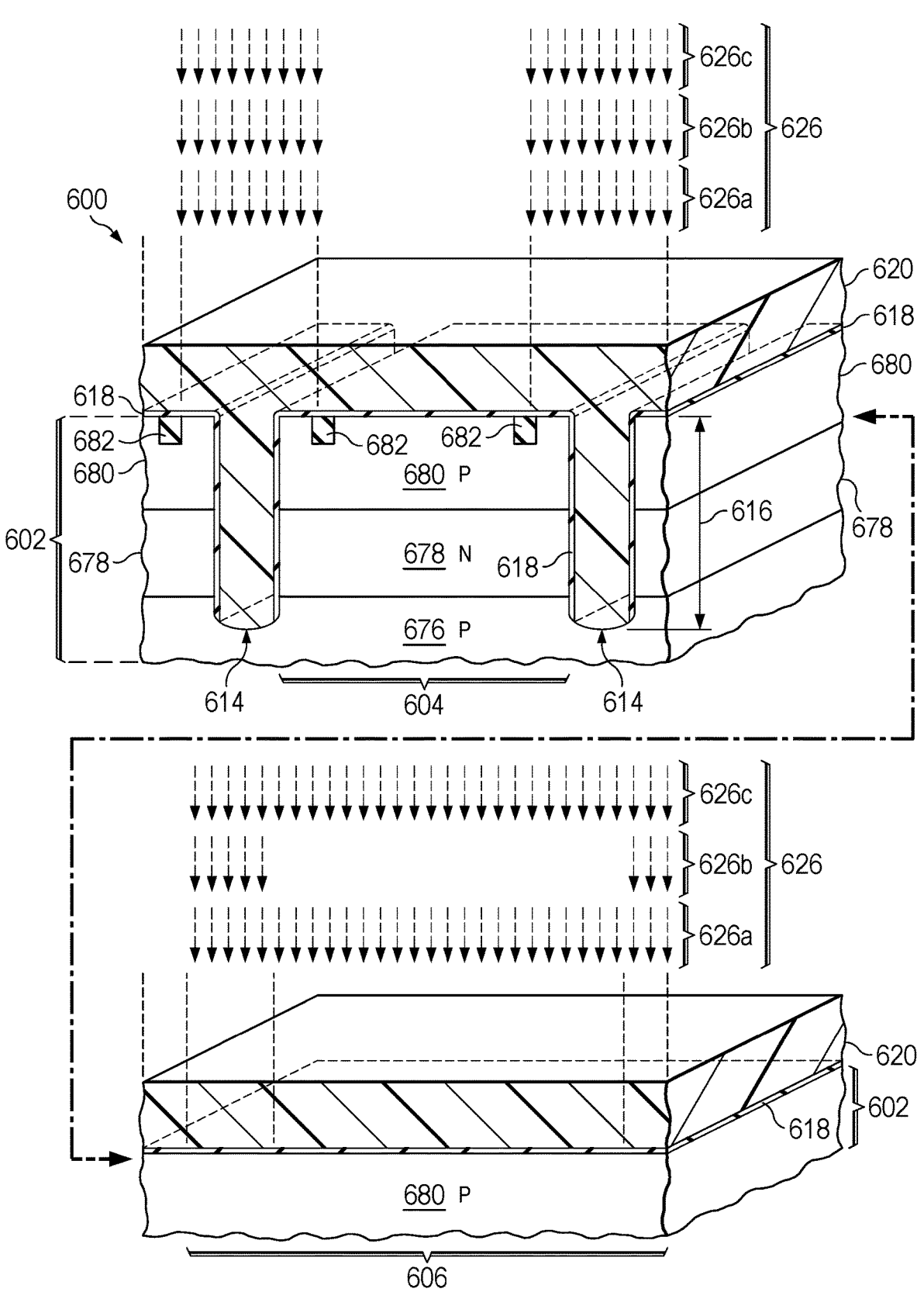
FIG. 6A through FIG. 6J are cross sections of another example method of forming a microelectronic device.

FIG. 6A through FIG. 6J are cross sections of another example method of forming a microelectronic device. Referring to FIG. 6A, the microelectronic device 600 is formed in and on a substrate 602. The substrate 602 includes a semiconductor material, such as silicon. The substrate 602 includes an isolated transistor 604, hereinafter the transistor 604. The substrate 602 includes a thickness monitor 606. The thickness monitor 606 may be located in the microelectronic device 600, in a singulation lane of the substrate 602, or in a plug bar of the substrate 602, by way of example.

The substrate 602 of this example includes a base semiconductor material 676 having a first conductivity type. In the version of this example described in FIG. 6A through FIG. 6J, the first conductivity type is disclosed as p-type. In other versions, the first conductivity type may be n-type.

The substrate 602 of this example includes a buried layer 678 of semiconductor material over the base semiconductor material 676. The buried layer 678 has a second conductivity type, opposite from the first conductivity type; in version of this example described in FIG. 6A through FIG. 6J, the second conductivity type is disclosed as n-type.

The substrate 602 of this example includes a component semiconductor layer 680 over the buried layer 678. The component semiconductor layer 680 has the first conductivity type. The component semiconductor layer 680 may be formed by an epitaxial process.

The microelectronic device 600 includes trenches 614 extending through the component semiconductor layer 680 and the buried layer 678, and into the base semiconductor material 676. The trenches 614 laterally surround the area for the transistor 604. The trenches 614 may have trench depths 616 of 2 microns to 8 microns, and may have width-to-depth ratios of 5 to 10, for example. The trenches 614 are formed concurrently, resulting in the trench depths 616 being equal to within 5 percent.

A trench dielectric layer 618 is formed on the substrate 602, extending over the thickness monitor 606 and extending into the trenches 614. The trench dielectric layer 618 may include silicon dioxide formed by a thermal oxidation process. The trench dielectric layer 618 is removed at bottoms of the trenches 614, exposing the base semiconductor material 676. The trench dielectric layer 618 may be removed at the bottoms of the trenches 614 by an anisotropic etch process such as an RIE process.

Field oxide 682 may be formed on the substrate 602 in the area for the transistor 604. The field oxide 682 may have a shallow trench isolation (STI) structure, as indicated in FIG. 6A, or may have a local oxidation of silicon (LOCOS) structure.

First photoresist 620 is formed over the substrate 602 and the trench dielectric layer 618. The first photoresist 620 fills the trenches 614 and extends over the substrate 602 and the trench dielectric layer 618 adjacent to the trenches 614 and covers the thickness monitor 606. The first photoresist 620 may have any of the compositions, and may be formed by any of the process sequences, disclosed in reference to the first photoresist 120 of FIG. 1B.

The first photoresist 620 is exposed using a maskless photolithography process that provides a sequence of doses of first UV light 626, including a first UV light dose 626a, followed by a second UV light dose 626b, followed by a third UV light dose 626c. The doses of the first UV light 626 are spatially modulated. In this example, the first UV light dose 626a exposes the first photoresist 620 in and over the trenches 614 and over the thickness monitor 606, but does not expose the first photoresist 620 over the transistor 604. The second UV light dose 626b exposes the first photoresist 620 in and over the trenches 614, but does not expose the first photoresist 620 over the transistor 604 or over the thickness monitor 606. The third UV light dose 626c exposes the first photoresist 620 in and over the trenches 614 and over the thickness monitor 606, but does not expose the first photoresist 620 over the transistor 604. The cumulative exposure by the sequence of doses of the first UV light 626 exposes the first photoresist 620 in and over the trenches 614 at a first trench energy dose, and exposes the first photoresist 620 on the thickness monitor 606 at a first monitor energy dose, which is less than the first trench energy dose. Some areas of the first photoresist 620 may get none of the first UV light 626.

Figure 6B:
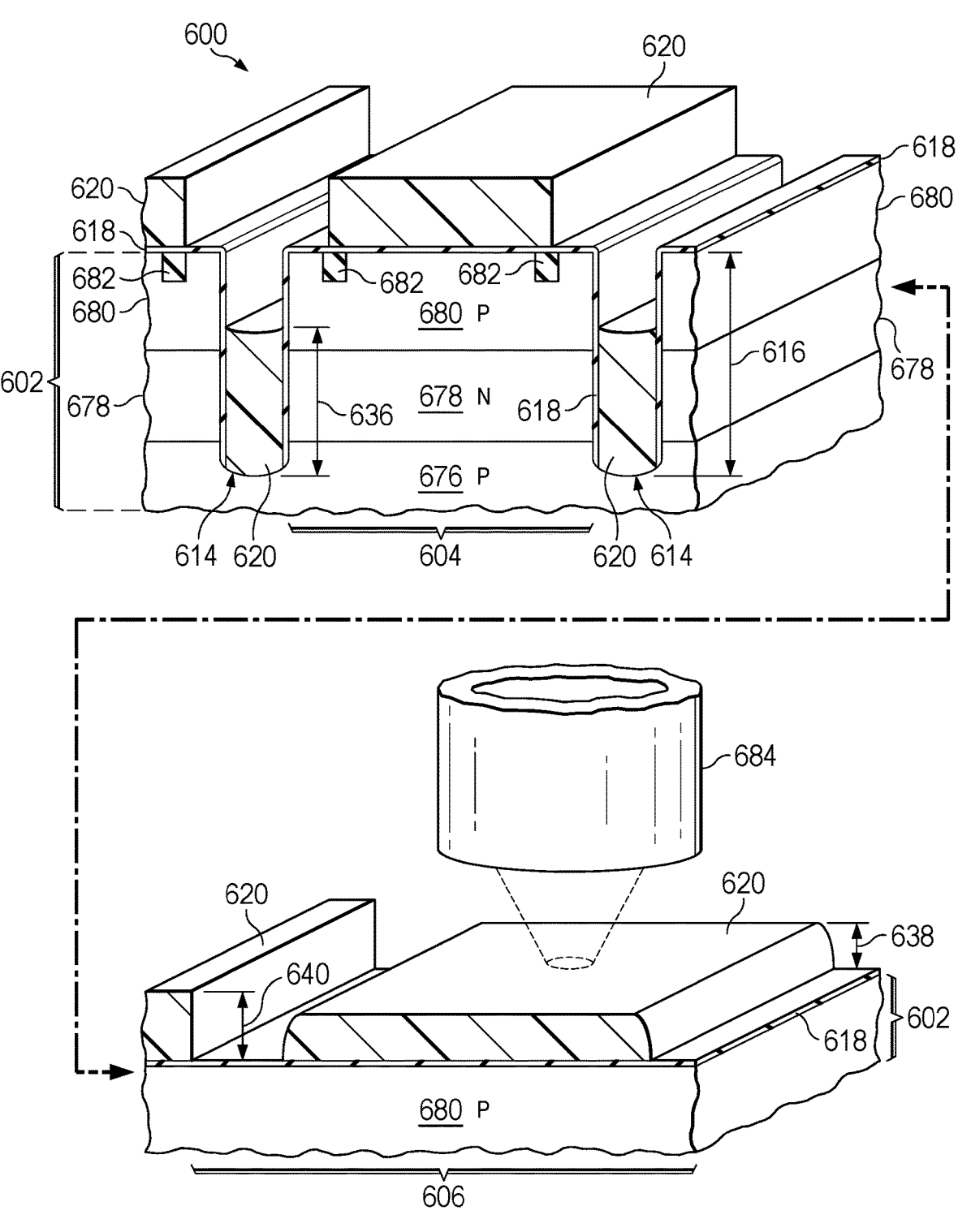

Referring to FIG. 6B, the first photoresist 620 is developed by dissolving the portion of the first photoresist 620 which received a full exposure energy density in developer solution. The portion of the first photoresist 620 which received less than the full exposure energy density remains in the trenches 614 and on the thickness monitor 606. Portions of the first photoresist 620 which received no UV exposure may lose less than 5 percent thickness to dissolution by the developer solution. The first photoresist 620 has a first in-trench thickness 636 in the trenches 614, and has a first in-monitor thickness 638 on the thickness monitor 606. The first in-trench thickness 636 is less than an average of the trench depths 616. The first in-monitor thickness 638 is less than a first unexposed thickness 640 of the portions of the first photoresist 620 which received no UV exposure.

The first in-monitor thickness 638 of the first photoresist 620 is measured. The first photoresist 620 on the thickness monitor 606 may be measured by optical reflection spectroscopy using an optical reflection spectrometer 684, as depicted in FIG. 6B. Other methods of measuring the first in-monitor thickness 638 are within the scope of this example.

Figure 6C:
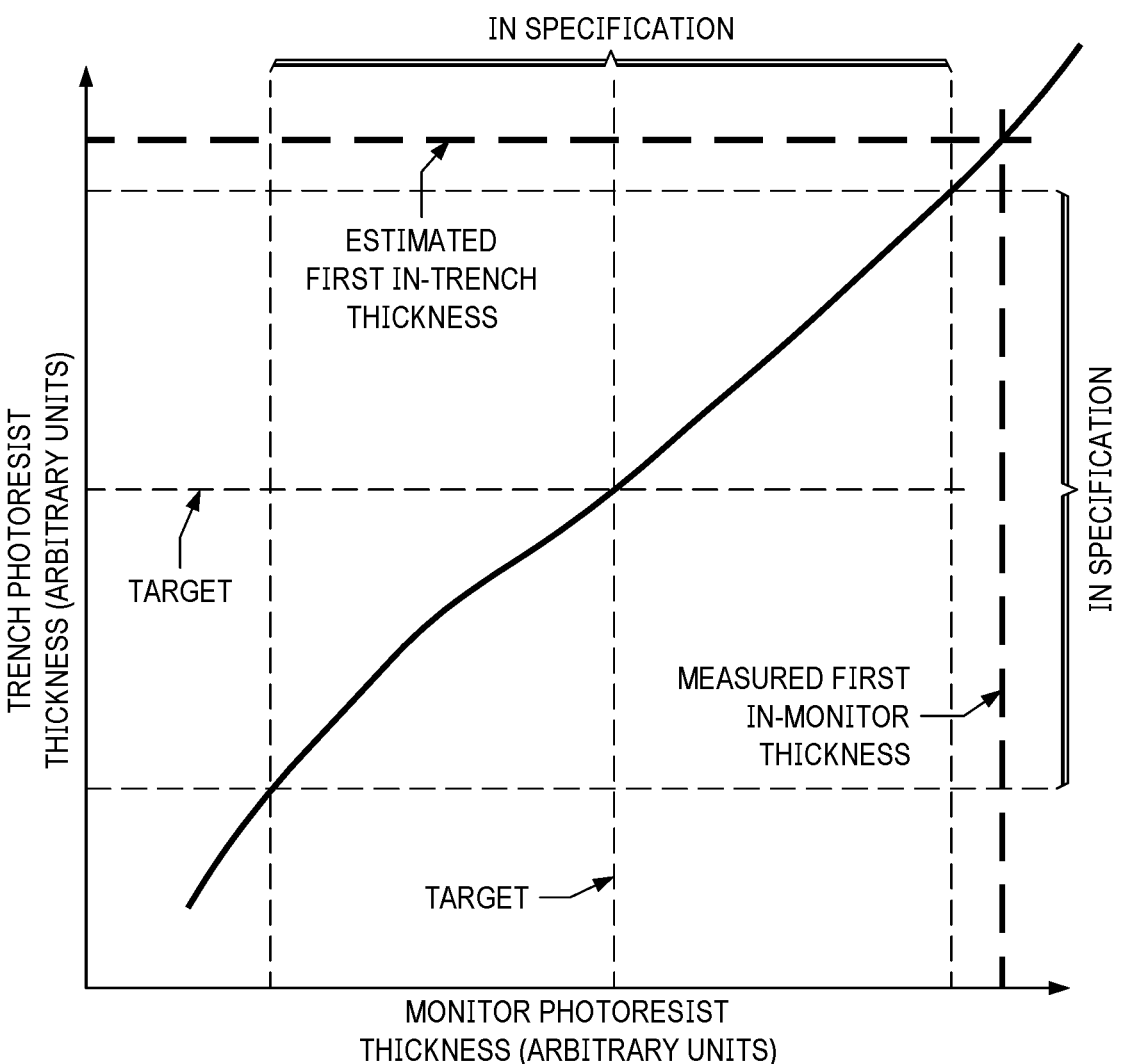

Referring to FIG. 6C, the first in-trench thickness 636 of the first photoresist 620 of FIG. 6B is estimated using the first in-monitor thickness 638 as measured in reference to FIG. 6B and a calibration chart, labeled "CALIBRATION CHART OF IN-TRENCH THICKNESS VERSUS IN-MONITOR THICKNESS." The calibration chart is similar to the calibration chart of FIG. 1E. In this example, the measured value of the first in-monitor thickness 638 acquired as disclosed in reference to FIG. 6B, and the corresponding estimated value of the first in-trench thickness 636, are greater than the upper limit of the in-specification zone. Because the estimated value of the first in-trench thickness 636 in this example is out of the in-specification zone, fabrication of the microelectronic device 600 of FIG. 6B includes a rework sequence, as disclosed in reference to FIG. 6D through FIG. 6H.

Figure 6D:
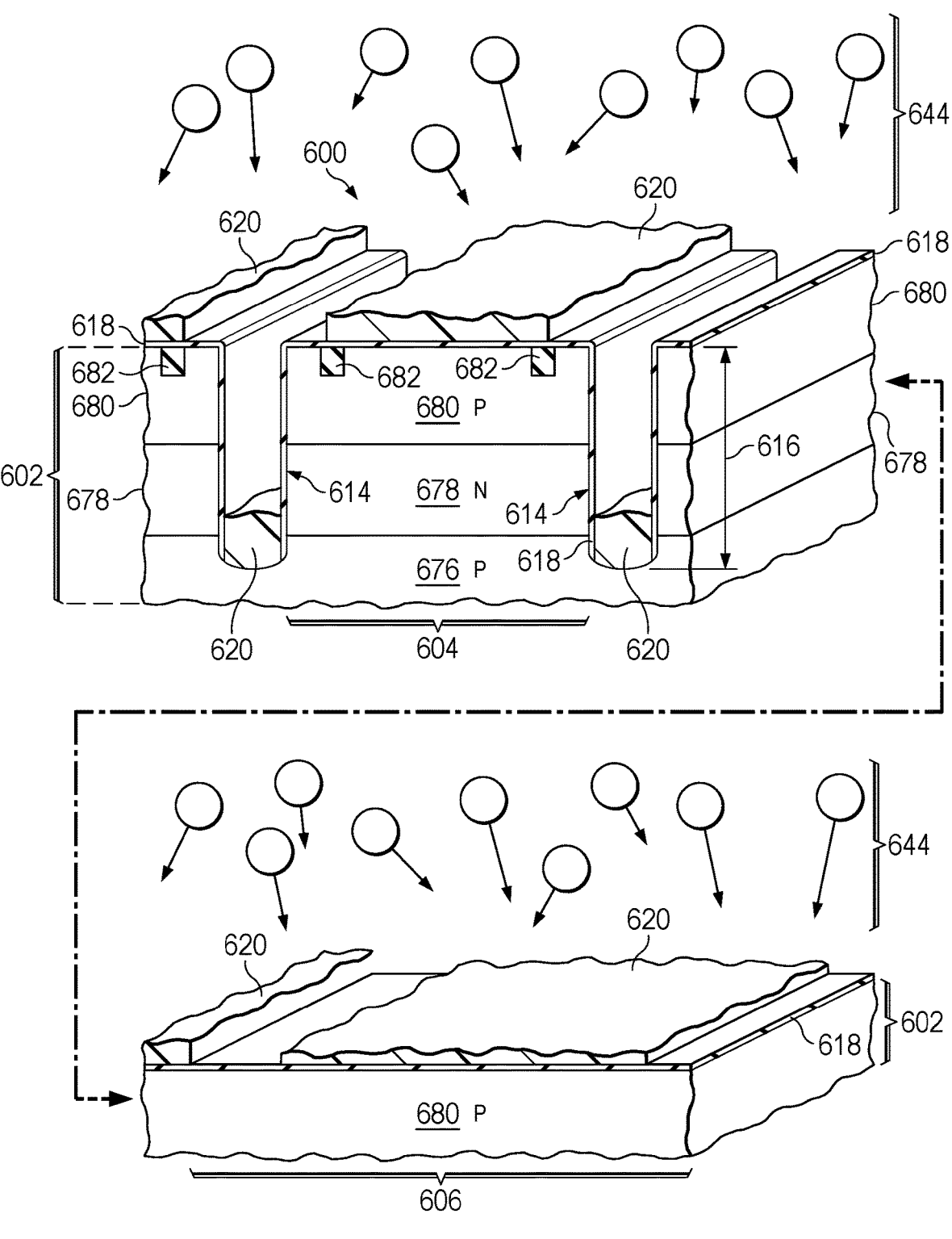

Referring to FIG. 6D, the first photoresist 620 is removed. The first photoresist 620 may be removed by a two-step process. A first step may include a plasma etch process using oxygen radicals 644 to remove a majority of the first photoresist 620. FIG. 6D depicts the first photoresist 620 partway to removal by the oxygen radicals 644.

Figure 6E:
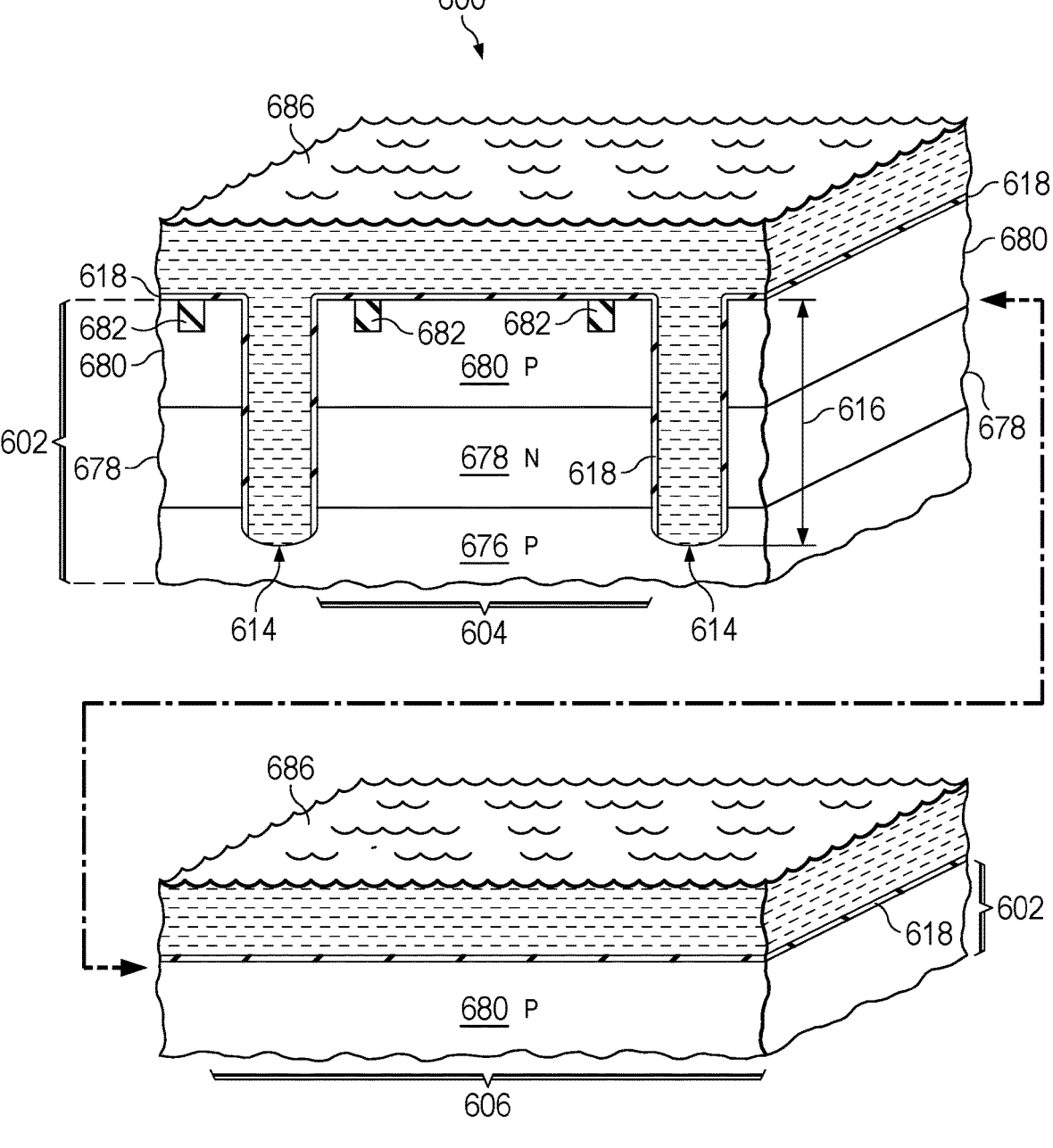

Referring to FIG. 6E, residue, not specifically shown, of the first photoresist 620 of FIG. 6D that remains after the plasma etch process is removed by a second step of the two step process; the second step includes a wet clean process using an aqueous mixture 686 of hydrogen peroxide and sulfuric acid, by way of example.

Figure 6F:
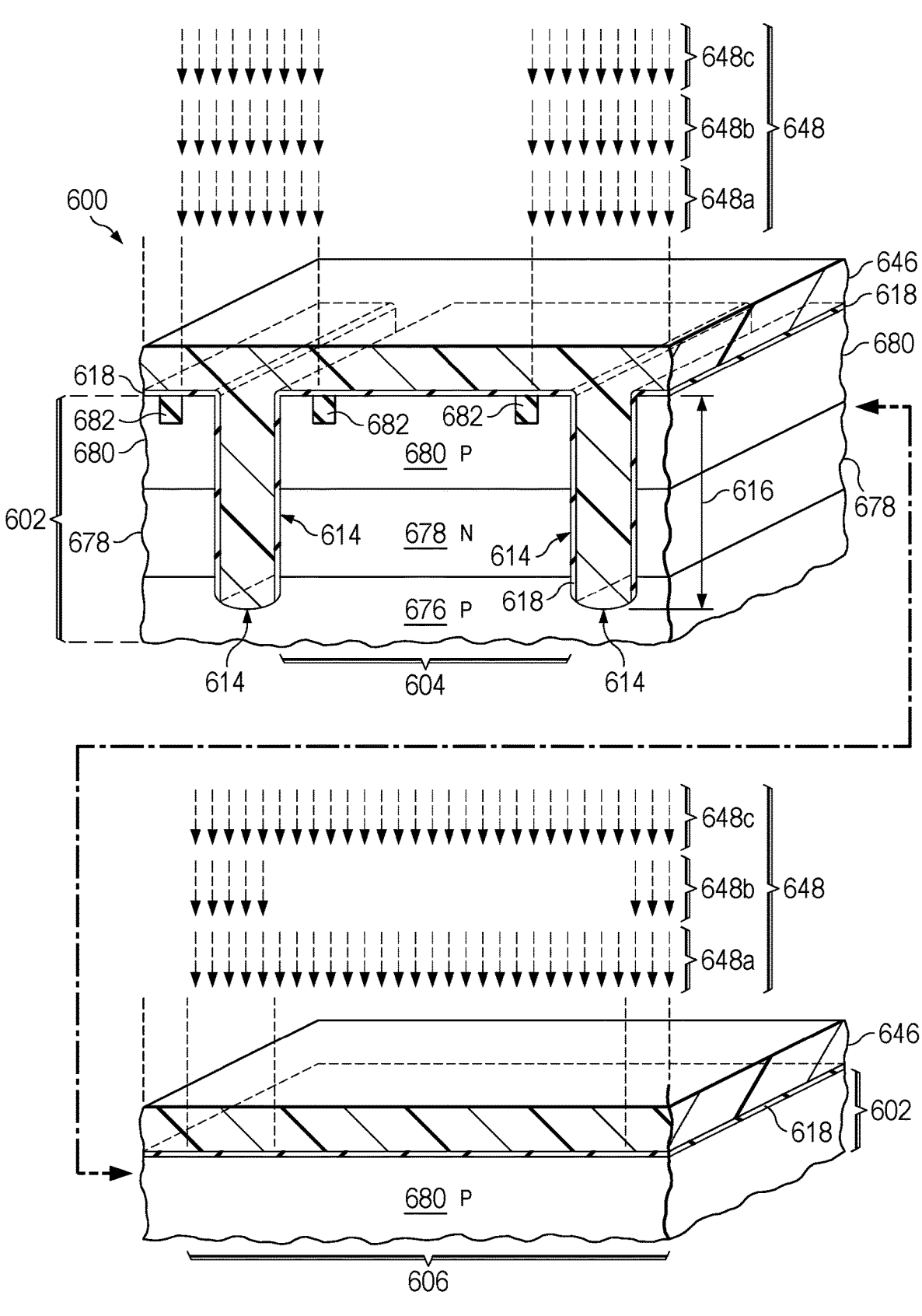

Referring to FIG. 6F, second photoresist 646 is formed over the substrate 602 and the trench dielectric layer 618, filling the trenches 614 and covering the thickness monitor 606. The second photoresist 646 may have the same composition as the first photoresist 620 of FIG. 6A. Process parameters, such as spin speed, to form the second photoresist 646 may be adjusted to provide a subsequent estimated in-trench thickness within the in-specification zone. In this example, the spin speed may be increased to reduce a thickness of the second photoresist 646.

The second photoresist 646 is exposed using a similar photolithography process as disclosed in reference to FIG. 2A, providing a sequence of doses of second UV light 648, including a first UV light dose 648a, followed by a second UV light dose 648b, followed by a third UV light dose 648c. The doses of the second UV light 648 are spatially modulated, as disclosed in reference to FIG. 6A. The doses of the second UV light 648 may be adjusted to provide a subsequent estimated in-trench thickness within the in-specification zone. In this example, the doses of the second UV light 648 may be increased over the trenches 614 and proportionately increased over the thickness monitor 606, to expose more of the second photoresist 646 above the full exposure energy density. The cumulative exposure by the sequence of doses of the second UV light 648 exposes the second photoresist 646 in and over the trenches 614 at a second trench energy dose, and exposes the second photoresist 646 on the thickness monitor 606 at a second monitor energy dose, which is less than the second trench energy dose. Some areas of the second photoresist 646 may get none of the second UV light 648.

Figure 6G:
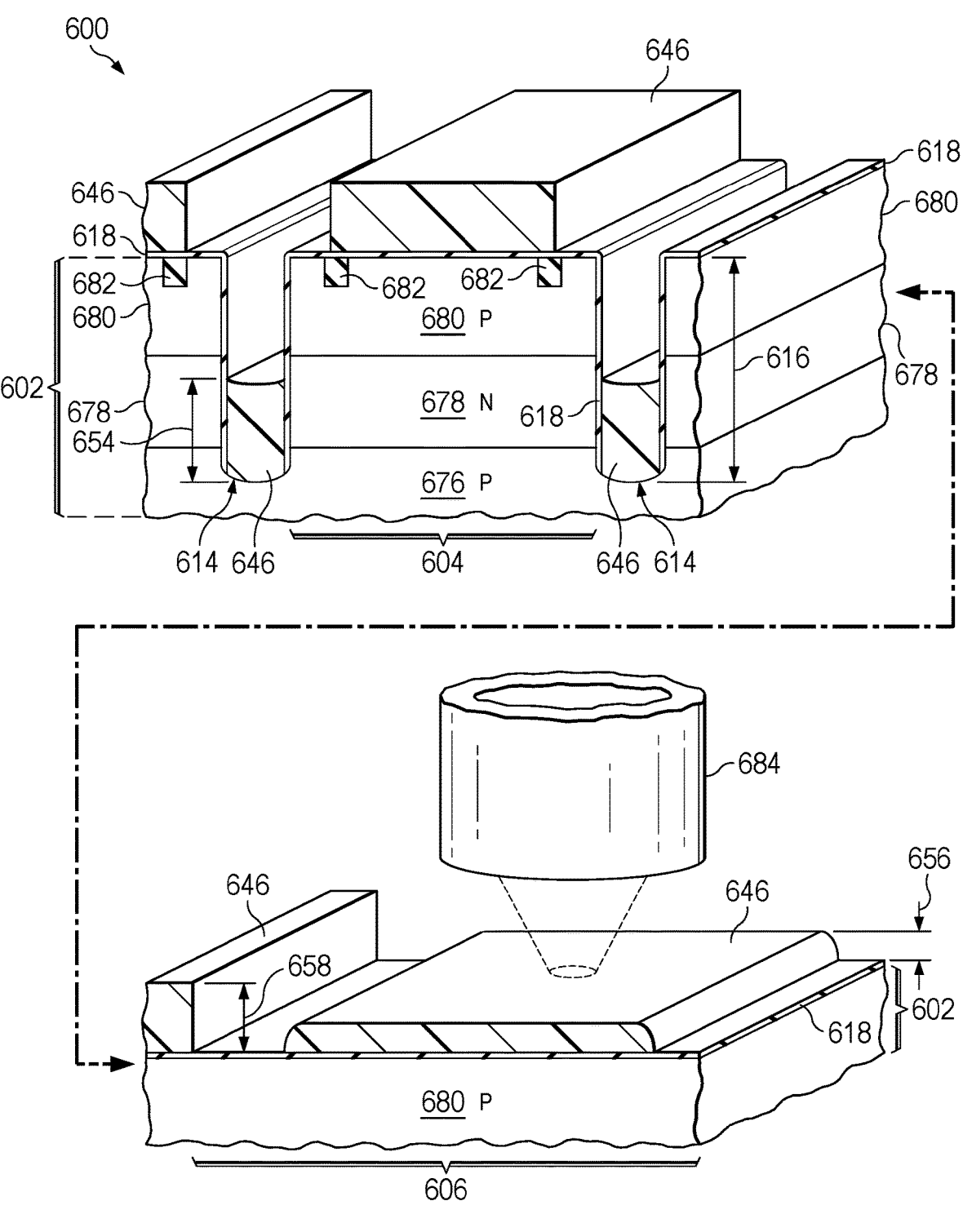

Referring to FIG. 6G, the second photoresist 646 is developed by dissolving the portion of the second photoresist 646 which received a full exposure energy density in developer solution. After developing, the second photoresist 646 has a second in-trench thickness 654 in the trenches 614, and has a second in-monitor thickness 656 on the thickness monitor 606. The second in-trench thickness 654 is less than an average of the trench depths 616. The second in-monitor thickness 656 is less than a second unexposed thickness 658 of the portions of the second photoresist 646 which received no UV exposure. The second in-monitor thickness 656 of the second photoresist 646 is measured using the same method as used to measure the first in-monitor thickness 638 of FIG. 6B. FIG. 6G depicts the second in-monitor thickness 656 being measured by the optical reflection spectrometer 684 disclosed in reference to FIG. 6B.

Figure 6H:
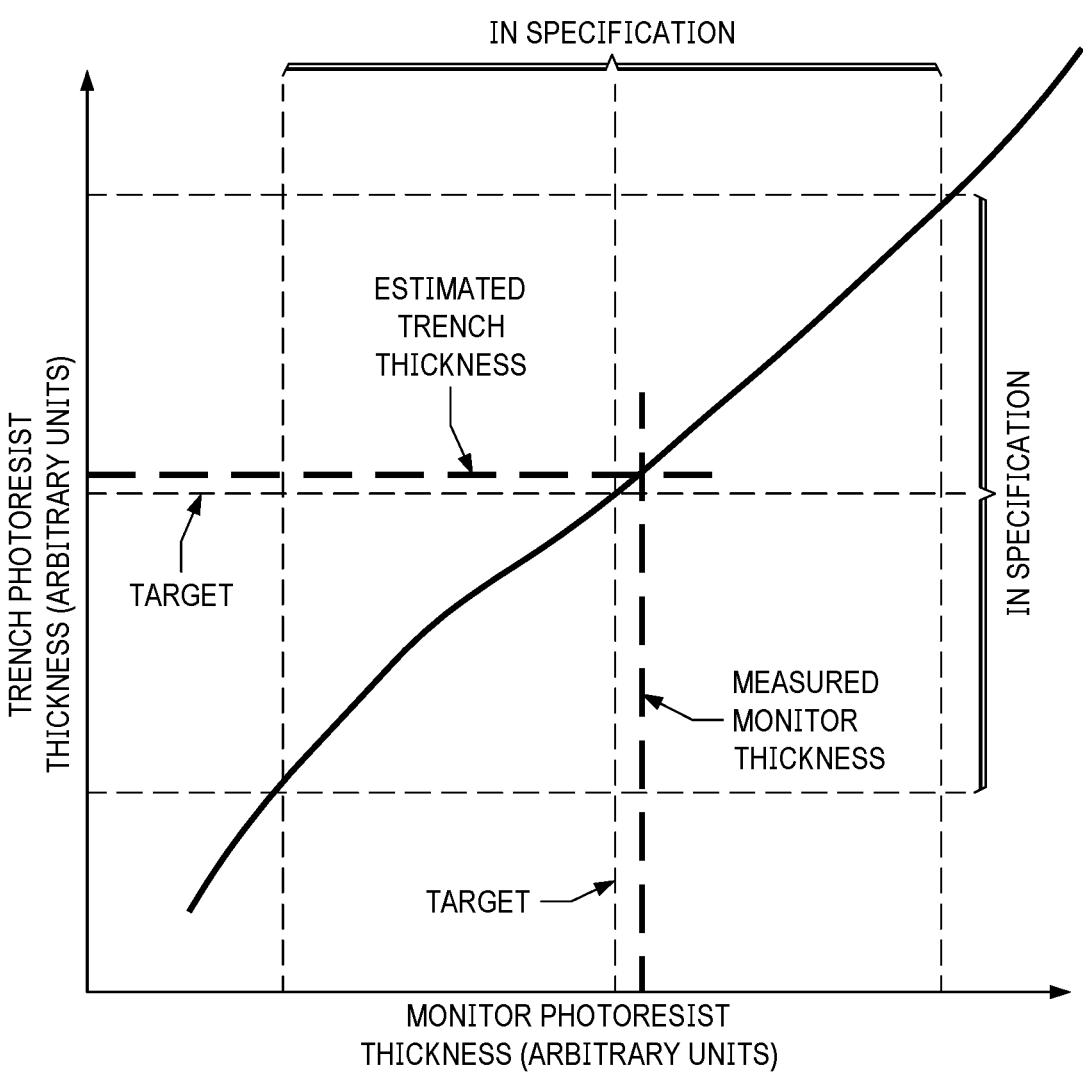

Referring to FIG. 6H, the second in-trench thickness 654 of the second photoresist 646 of FIG. 6G is estimated using the second in-monitor thickness 656 as measured in reference to FIG. 6G and the calibration chart, disclosed in reference to FIG. 6C, and shown in FIG. 6H. In this example, the measured value of the second in-monitor thickness 656 acquired as disclosed in reference to FIG. 6G, and the corresponding estimated value of the second in-trench thickness 654, are within the in-specification zone. Because the estimated value of the second in-trench thickness 654 in this example is in the in-specification zone, fabrication of the microelectronic device 600 of FIG. 6G continues with formation of doped sheaths 688 around the trenches 614, as disclosed in reference to FIG. 6I.

Figure 6I:
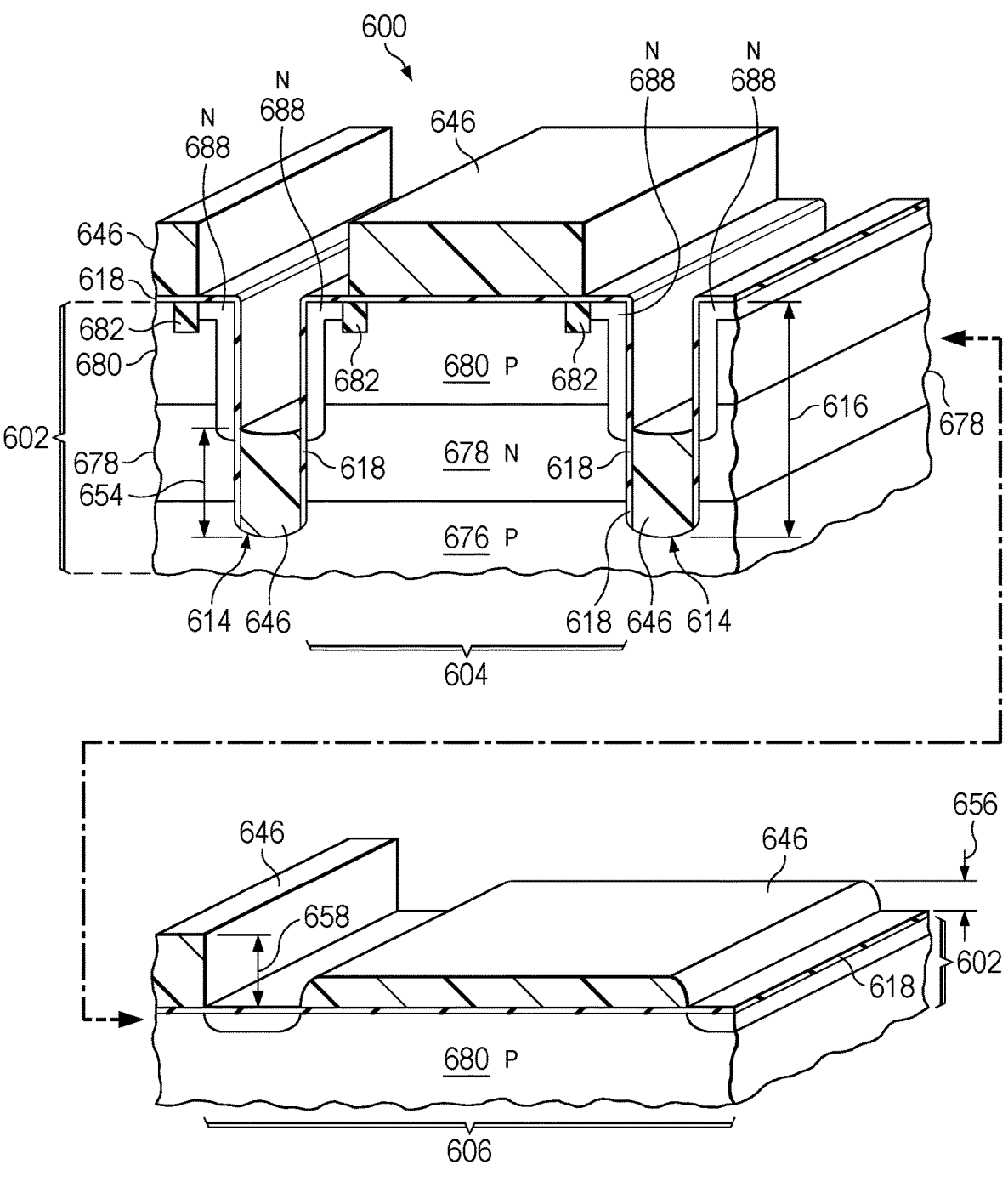

Referring to FIG. 6I, dopants of the second conductivity type are implanted into the substrate 602 along sidewalls of the trenches 614 where exposed by the second photoresist 646, to form the doped sheaths 688 extending to the buried layer 678. The doped sheaths 688 provide an electrical connection from the top surface of the substrate 602 to the buried layer 678. In versions of this example in which the second conductivity type is n-type, as depicted in FIG. 6I, the dopants of the second conductivity type may include phosphorus, arsenic, or antimony. In versions of this example in which the second conductivity type is n-type, the dopants of the second conductivity type may include boron. The dopants of the second conductivity type may be implanted into the substrate 602 along sidewalls of the trenches 614 by an ion beam process tilted at an angle with respect to the top surface of the substrate 602. Alternatively, the dopants of the second conductivity type may be implanted into the substrate 602 along sidewalls of the trenches 614 by a plasma ion implant process. The second photoresist 646 in the trenches 614 prevents the dopants of the second conductivity type from counter doping the base semiconductor material 676 exposed at the bottoms of the trenches 614.

After the dopants of the second conductivity type are implanted into the substrate 602 along sidewalls of the trenches 614, the second photoresist 646 is removed. The second photoresist 646 may be removed by a plasma process with oxygen radicals followed by a wet clean process, by way of example.

After the second photoresist 646 is removed, the substrate 602 is heated to activate the implanted dopants of the second conductivity type in the doped sheaths 688. The substrate 602 may be heated by a flash anneal process or by a rapid thermal process, by way of example.

Figure 6J:
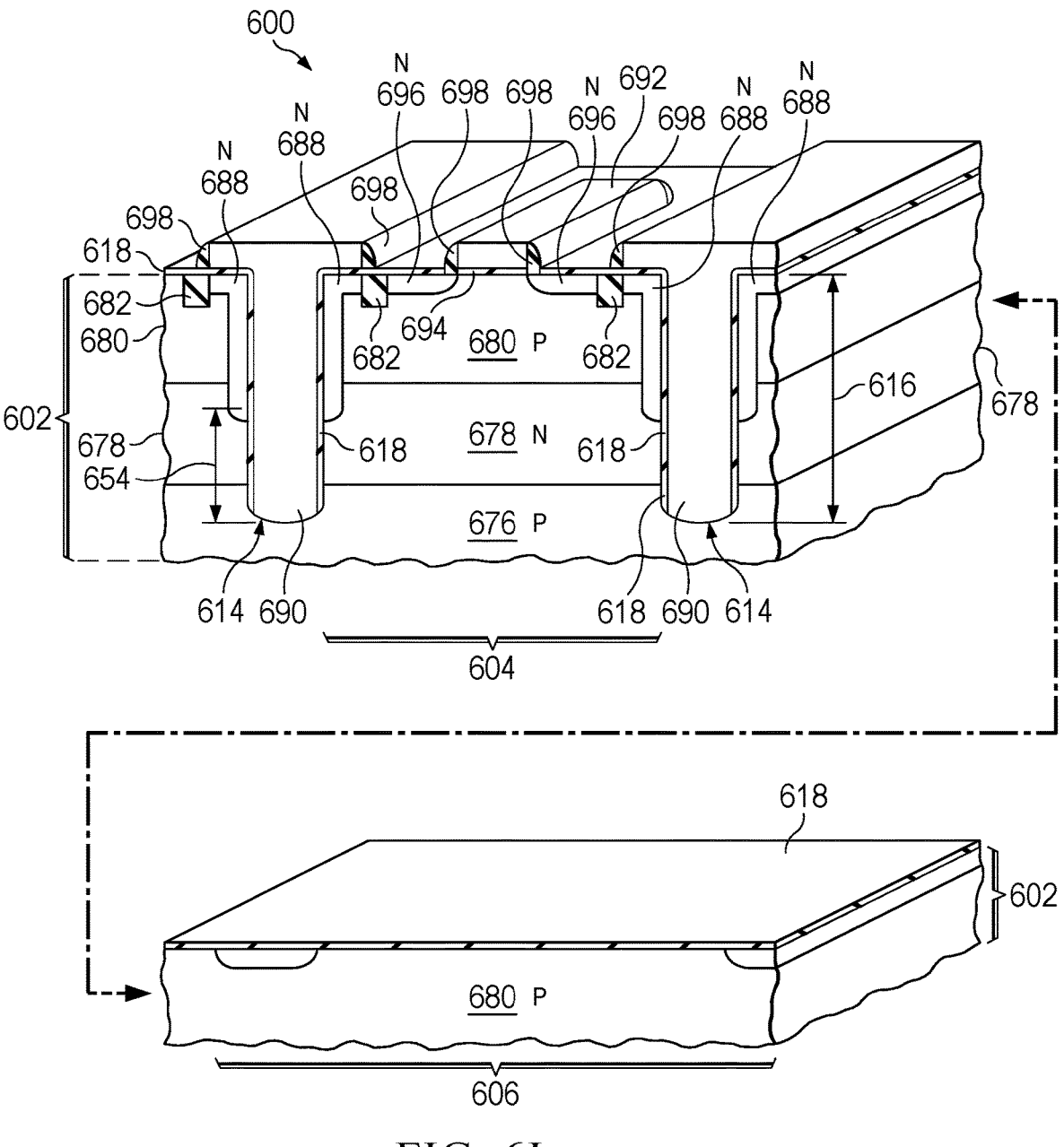

Referring to FIG. 6J, trench fill material 690 is formed in the trenches 614, contacting the base semiconductor material 676. The trench fill material 690 is electrically conductive and provides an electrical connection to the base semiconductor material 676 extending above the trenches 614. The trench fill material 690 may include polysilicon having the first conductivity type. A transistor gate 692 is formed on a gate dielectric layer 694 over the component semiconductor layer 680 in the transistor 604. The transistor gate 692 may include polysilicon, and may be formed concurrently with the trench fill material 690. Polysilicon in the trench fill material 690 and the transistor gate 692 may be formed by decomposition of silane. Source/drain regions 696 having the second conductivity type are formed in the component semiconductor layer 680 adjacent to the transistor gate 692. Sidewall spacers 698 may be formed abutting the transistor gate 692 and the trench fill material 690.

The trenches 614 combined with the buried layer 678 electrically isolate the transistor 604, enabling the transistor to operate with a source potential different from a ground potential applied to the base semiconductor material 676. The trench fill material 690 provides a connection to the base semiconductor material 676, enabling a bias to be applied adjacent to the transistor 604 to reduce debiasing of the base semiconductor material 676. The doped sheaths 688 provide electrical connections to the buried layer 678 that consume less area than sinkers or deep wells.

Figure 7:
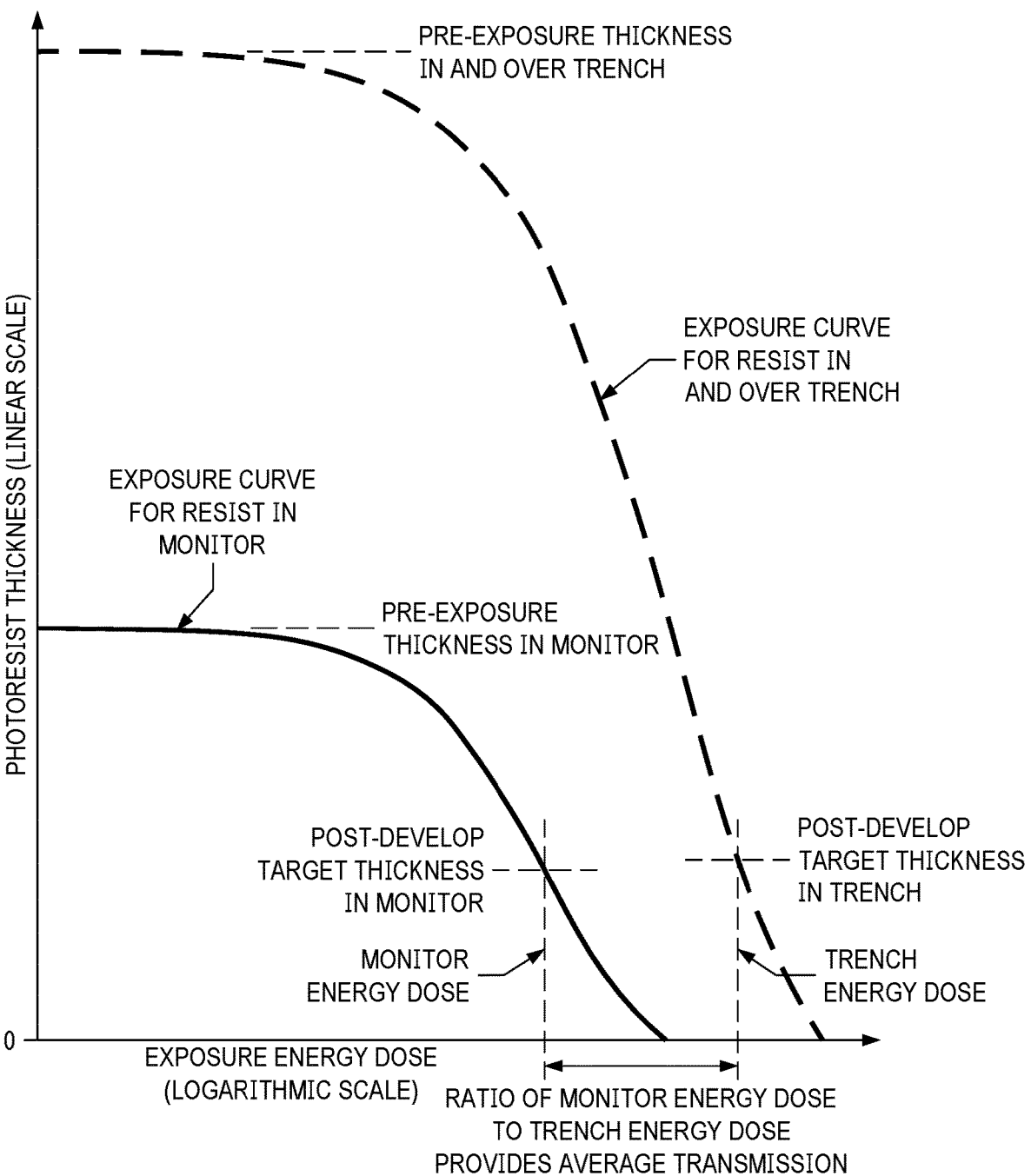
FIG. 7 depicts a graphical method for determining an appropriate value for the trench energy dose and the monitor energy dose.

FIG. 7 depicts a graphical method for determining an appropriate value for the trench energy dose and the monitor energy dose, disclosed in reference to FIG. 1C. This method applies to other steps of patterning photoresist in trenches. FIG. 7 includes a photoresist exposure chart, labeled "DUAL PHOTORESIST EXPOSURE CHART," for two thicknesses of a photoresist. The vertical axis, labeled "PHOTORESIST THICKNESS (LINEAR SCALE)," of the photoresist exposure chart plots values of the photoresist thickness on a linear scale as a function of exposure energy dose, plotted on a logarithmic scale on the horizontal axis, labeled "EXPOSURE ENERGY DOSE (LOGARITHMIC SCALE)." An exposure energy dose value at the vertical axis, that is, the origin of the photoresist exposure chart, is low, so that less than 5 percent of the photoresist is dissolved during the develop process. Along the horizontal axis, the exposure curves fall to zero at values of the exposure energy dose that fully expose all the photoresist above the full exposure energy density. The exposure energy dose to fully expose all the photoresist increases with the thickness of the photoresist.

The photoresist exposure chart includes a trench exposure curve, labeled "EXPOSURE CURVE FOR RESIST IN AND OVER TRENCH," for the photoresist 120, in and over the trenches 114. At low exposure energy dose, that is, at the vertical axis, the trench exposure curve has a value of the total photoresist thickness from the bottoms of the trenches 114 to the top of the photoresist 120 over the trenches 114, corresponding to the first unexposed thickness 140 plus the trench depth 116 minus a thickness of the trench dielectric layer 118 at the bottoms of the trenches 114, as depicted in FIG. 1B. At higher exposure energy doses, the trench exposure curve drops monotonically. The trench energy dose, that is, the value of the exposure energy dose to leave the target in-trench thickness of the photoresist 120 in the trenches 114 is found on the trench exposure curve where the vertical coordinate equals the target in-trench thickness, as depicted in FIG. 7.

The photoresist exposure chart also includes a monitor exposure curve, labeled "EXPOSURE CURVE FOR RESIST IN MONITOR," for the photoresist 120, in the thickness monitor 106. At the vertical axis, the monitor exposure curve has a value of the first unexposed thickness 140, as depicted in FIG. 1B. At higher exposure energy doses, the monitor exposure curve also drops monotonically. The monitor energy dose, that is, the value of the exposure energy dose to leave the target in-monitor thickness of the photoresist 120 in the thickness monitor 106 is found on the monitor exposure curve where the vertical coordinate equals the target in-monitor thickness, as depicted in FIG. 7.

A ratio of the monitor energy dose to the trench energy dose, as determined from the photoresist exposure chart, provides a value for the average transmission of the photomask for the monitor area.

Various features of the examples disclosed herein may be combined in other manifestations of methods of forming microelectronic devices. For example, either of the methods disclosed in reference to FIG. 1A through FIG. 1O and in reference to FIG. 6A through FIG. 6J may involve a single trench or multiple trenches. Either of the methods disclosed in reference to FIG. 1A through FIG. 1O and in reference to FIG. 6A through FIG. 6J may implement photolithography processes using photomasks or may implement maskless photolithography processes. Either of the methods disclosed in reference to FIG. 1A through FIG. 1O and in reference to FIG. 6A through FIG. 6J may measure photoresist in the thickness monitors using any of the methods disclosed herein, including stylus profilometry, AFM profilometry, ellipsometry, optical reflection spectroscopy, or optical profilometry.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A method of forming a microelectronic device, comprising:

exposing photoresist on a device substrate having a trench and a monitor area, the monitor area being planar, wherein the photoresist in the trench is exposed at a first energy dose and the photoresist on the monitor area is exposed at a second energy dose that is different than the first energy dose; and developing the photoresist, wherein an in-trench thickness of the photoresist is left in the trench and an in-monitor thickness of the photoresist is left on the monitor area.

2. The method of claim 1, wherein the second energy dose is less than the first energy dose.

3. The method of claim 1, including measuring the in-monitor thickness.

4. The method of claim 3, wherein measuring the in-monitor thickness includes an ellipsometry process.

5. The method of claim 3, wherein measuring the in-monitor thickness includes a contact profilometry process.

6. The method of claim 3, wherein measuring the in-monitor thickness includes an optical spectroscopy process.

7. The method of claim 3, wherein measuring the in-monitor thickness includes a non-contact profilometry process.

8. The method of claim 3, including estimating the in-trench thickness using the measured in-monitor thickness.

9. The method of claim 8, including:

exposing a second photoresist on a calibration substrate having a calibration trench and a calibration monitor area, the calibration monitor area being planar, wherein the second photoresist in the calibration trench is exposed at the first energy dose and the second photoresist on the calibration monitor area is exposed at the second energy dose;

developing the second photoresist on the calibration substrate, wherein a trench calibration thickness of the second photoresist is left in the calibration trench and a monitor calibration thickness of the second photoresist is left on the calibration monitor area;

measuring the trench calibration thickness, prior to exposing the photoresist on the device substrate; and measuring the monitor calibration thickness, prior to exposing the photoresist on the device substrate.

10. The method of claim 1, including removing material from the trench where exposed by the photoresist in the trench.

11. The method of claim 10, wherein removing material from the trench includes removing silicon dioxide from a liner in the trench.

12. The method of claim 1, including implanting dopants into the device substrate abutting the trench, where exposed by the photoresist in the trench.

13. The method of claim 1, including:

exposing a second photoresist on the device substrate, wherein the second photoresist in the trench is exposed at a third energy dose and the second photoresist on the monitor area is exposed at a fourth energy dose that is different than the third energy dose; and developing the second photoresist, wherein a third thickness of the second photoresist is left in the trench and a fourth thickness of the second photoresist is left on the monitor area, the third thickness being greater than the in-trench thickness and the fourth thickness being greater than the in-monitor thickness.

14. The method of claim 1, wherein exposing the photoresist in the monitor area at the second energy dose is performed with a photomask having a pattern of light blocking features having dimensions less than twice a wavelength of light used for exposing the photoresist.

15. The method of claim 1, wherein exposing the photoresist in the monitor area at the second energy dose is performed by a maskless photolithography process having a temporally modulated exposure dose in the monitor area.

16. The method of claim 1, further including:

measuring the in-monitor thickness;

estimating the in-trench thickness using the measured in-monitor thickness using a calibration chart, wherein the calibration chart indicates the estimated in-trench thickness is out of specification;

removing the photoresist;

forming a second photoresist on the device substrate;

exposing the second photoresist in the trench is at a third energy dose and exposing the second photoresist on the monitor area at a fourth energy dose that is different than the third energy dose;

developing the second photoresist, wherein a second in-trench thickness of the second photoresist is left in the trench and a second in-monitor thickness of the second photoresist is left on the monitor area;

measuring the second in-monitor thickness; and estimating the second in-trench thickness using the measured second in-monitor thickness using the calibration chart.

17. The method of claim 16, wherein the fourth energy dose is less than the third energy dose.

18. The method of claim 16, wherein the third and fourth energy doses are identical to the first and second energy doses, respectively.

19. The method of claim 1, wherein the photoresist is a positive tone photoresist.

20. The method of claim 1, wherein developing the photoresist includes dissolving an exposed portion of the photoresist in an aqueous alkaline solution.

21. The method of claim 1, wherein the monitor area is at a top surface of the device substrate.

22. The method of claim 1, wherein the device substrate adjacent to the trench provides a drift region of a transistor.

23. A method of forming a microelectronic device, comprising:

exposing photoresist on a device substrate having a trench and a monitor area, the monitor area being planar, wherein the photoresist in the trench is exposed at a first energy dose and the photoresist on the monitor area is exposed at a second energy dose through a photomask having sub-resolution features; and developing the photoresist, wherein an in-trench thickness of the photoresist is left in the trench and an in-monitor thickness of the photoresist is left on the monitor area.

\* \* \* \* \*